(12) United States Patent
Scholz et al.

(10) Patent No.: US 9,753,375 B2
(45) Date of Patent: Sep. 5, 2017

(54) ILLUMINATION OPTICAL UNIT FOR PROJECTION LITHOGRAPHY

(71) Applicant: Carl Zeiss SMT GmbH, Oberkochen (DE)

(72) Inventors: Axel Scholz, Aalen (DE); Michael Patra, Oberkochen (DE); Frank Schlesener, Oberkochen (DE); Manfred Maul, Aalen (DE); Wolfgang Emer, Aalen (DE); Stefanie Hilt, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 426 days.

(21) Appl. No.: 14/327,721

(22) Filed: Jul. 10, 2014

(65) Prior Publication Data
US 2015/0015862 A1    Jan. 15, 2015

(30) Foreign Application Priority Data
Jul. 10, 2013    (DE) ........................ 10 2013 213 545

(51) Int. Cl.
*G01D 11/00*    (2006.01)
*G03F 7/20*    (2006.01)

(52) U.S. Cl.
CPC ...... *G03F 7/70191* (2013.01); *G03F 7/70075* (2013.01); *G03F 7/70108* (2013.01)

(58) Field of Classification Search
None
See application file for complete search history.

(56) References Cited

U.S. PATENT DOCUMENTS

| 7,414,781 B2 | 8/2008 | Mann et al. |
| 2006/0012799 A1 | 1/2006 | Wegmann |
| 2007/0279535 A1* | 12/2007 | Fiolka ................. G03F 7/70075 348/744 |
| 2009/0021715 A1* | 1/2009 | Deguenther ........ G03F 7/70075 355/67 |
| 2011/0069295 A1 | 3/2011 | Kraehmer et al. |
| 2013/0278913 A1 | 10/2013 | Maul et al. |

(Continued)

FOREIGN PATENT DOCUMENTS

| DE | 10 2005 026 628 A1 | 12/2005 |
| DE | 10 2004 063 314 | 7/2006 |
| DE | 10 2007 055 096 A1 | 5/2008 |

(Continued)

OTHER PUBLICATIONS

German Examination Report, with translation thereof, for DE Appl No. 10 2013 213 545.9, dated Feb. 11, 2014.

*Primary Examiner* — Erica Lin
(74) *Attorney, Agent, or Firm* — Fish & Richardson P.C.

(57) ABSTRACT

An illumination optical unit for projection lithography illuminates an illumination field with illumination light of a primary light source. The illumination optical unit has a raster arrangement to predefine a shape of the illumination field, a transfer optical unit for the superimposing transfer of the illumination light toward the illumination field, and an illumination angle variation device which deflects the illumination light with different deflection angles. The illumination angle variation device has at least one displaceable illumination angle variation unit to generate a deflection angle for the illumination light.

15 Claims, 28 Drawing Sheets

(56) References Cited

U.S. PATENT DOCUMENTS

2014/0176930 A1   6/2014  Deguenther et al.

FOREIGN PATENT DOCUMENTS

| DE | 10 2009 011 207 | 10/2009 |
|---|---|---|
| EP | 0 851 304 A2 | 7/1998 |
| WO | WO 2005/083512 A2 | 9/2005 |
| WO | WO 2007/093433 A1 | 8/2007 |
| WO | WO 2009/141033 A1 | 11/2009 |
| WO | WO 2011/157601 A2 | 12/2011 |

* cited by examiner

ILLUMINATION OPTICAL UNIT FOR PROJECTION LITHOGRAPHY

CROSS-REFERENCE TO RELATED APPLICATION

This application claims priority under 35 U.S.C. §119 to German Application No. 10 2013 213 545.9, filed Jul. 10, 2013, the entire contents of which are incorporated by reference herein.

FIELD

The disclosure relates to an illumination optical unit for projection lithography for illuminating an illumination field with illumination light. Furthermore, the disclosure relates to an optical system including such an illumination optical unit, and to a projection exposure apparatus including such an optical system. The disclosure furthermore relates to a lithographic production method for nano- or microstructured components. Finally, the disclosure relates to a component produced by such a method.

BACKGROUND

An illumination system of the type mentioned in the introduction is known from WO 2007/093433 A1, WO 2005/083512 A2 and WO 2011/157601 A2. For demanding projection tasks it is desirable to be able to influence the illumination light properties over the illumination field in a targeted fashion. With the illumination system of the generic type this is not possible, or is possible only with high outlay.

SUMMARY

The disclosure develops an illumination optical unit of the type mentioned in the introduction in such a way that it is possible to influence the illumination intensity over the illumination field in an illumination-angle-dependent manner in a targeted fashion.

The disclosure provides an illumination optical unit for projection lithography for illuminating an illumination field with illumination light of a primary light source. The illumination optical unit includes at least one raster arrangement which includes raster elements arranged in raster rows and raster columns. The raster elements influence the illumination light for predefining a shape of the illumination field. The illumination optical unit also includes a transfer optical unit for the superimposing transfer of the illumination light from the raster elements toward the illumination field, in which an object displaceable in an object displacement direction can be arranged. The illumination optical unit further includes an illumination angle variation device which deflects the illumination light incident on the illumination angle variation device in a deflection plane perpendicular to the object displacement direction in a location-dependent manner with different deflection angles. The illumination angle variation device includes at least an illumination angle variation unit displaceable overall relative to the raster arrangement and serving for generating a deflection angle for the illumination lighting the deflection plane perpendicular to the object displacement direction. The displaceability of the overall displaceable illumination angle variation unit relative to the raster arrangement serves for influencing a magnitude of the deflection angle in the deflection plane perpendicular to the object displacement direction. The illumination angle variation device according to the disclosure including at least one displaceable illumination angle variation unit makes possible, via a relative displacement of the at least one displaceable illumination angle variation unit with respect to the raster arrangement, targeted influencing of an entire deflection effect of the illumination angle variation device on the illumination light. Depending on the relative position of the displaceable illumination angle variation units with respect to the raster arrangement, this results in a specific deflection effect within a range between a minimum deflection angle in the deflection plane perpendicular to the object displacement direction and a maximum deflection angle in the deflection plane. This can be used for the targeted predefinition of a deflecting effect, such that a targeted predefinition of an illumination optimized for the projection lithography is possible for example via the predefined deflecting effect. The deflection angle in the deflection plane which can be brought about by the displaceable illumination angle variation unit is a maximum of 3° or 50 mrad, for example. A change in the deflection angle by, for example, 30 mrad between the maximum and the minimum deflection angle in the deflection plane can be brought about by the displaceable illumination angle variation unit. The change in the deflection angle can have a magnitude for example such that the displaceable illumination angle variation unit precisely compensates for a deflecting effect of another unit, such that precisely no deflecting effect arises as a result of both units. The magnitude of the deflection angle that can maximally be set can depend on the maximum acceptance angle of the raster arrangement. The angle can have a different value in the deflection plane from that in a plane which is perpendicular thereto and which contains the object displacement direction. The optically effective surfaces and in particular the angle variation portions of the illumination angle variation device can be fashioned as plane surfaces, can be fashioned as spherical surfaces, can be fashioned as aspherical surfaces or can be fashioned as freeform surfaces. Examples of optical freeform surface configurations can be found in U.S. Pat. No. 7,414,781. Part of the illumination optical unit can be a micro-mirror array (multi-mirror array, MMA), via the mutually independently tiltable individual mirrors of which it is possible to predefine an illumination light-intensity distribution on the raster arrangement of the illumination optical unit, which is in turn converted into an illumination angle distribution for illuminating the illumination field via the illumination optical unit. One example of a corresponding use of a micro-mirror array is given in WO 2011/157601 A2. The deflection of the illumination light in the deflection plane with different deflection angles can be effected in at least two angle variation portions of the illumination angle variation device. The illumination angle variation device can generate static deflection angles that are different in absolute terms in at least two angle variation portions. A continuous or else a discontinuous and in particular discrete spectrum of deflection angles can be generated via the illumination angle variation device.

The illumination angle variation device can also include at least one illumination angle variation unit having more than two angle variation portions in which the illumination light is deflected differently in the deflection plane. A deflecting effect can also change continuously depending on the location of incidence of the illumination light on the illumination angle variation device.

The different deflection angles which are brought about by the illumination angle variation device in the deflection plane perpendicular to the object displacement direction can be identical in terms of the absolute value of the angle and differ merely in their direction, for example +β, −β. Alternatively, it is possible to bring about deflections in different deflection directions with different absolute values of the angles, for example +β, −β/2. In a further variant of the illumination angle variation device, it is also possible for more than two different deflection angles to be brought about. In particular, a continuum of different deflection angles can be brought about by the illumination angle variation device.

The illumination angle variation device can include exactly one illumination angle variation unit, namely the displaceable illumination angle variation unit.

The illumination angle variation unit can be translationally and/or rotationally displaceable relative to the raster arrangement. The term "displaceable" therefore includes a displacement in relation to the six degrees of freedom of translation and rotation. A displacement in which exactly one of these degrees of freedom is used or in which more than one of these degrees of freedom, for example two, three, four, five or all six degrees of freedom, are used is also possible. In a cartesian coordinate system, of which two coordinates span the deflection plane and one coordinate is predefined by the object displacement direction, the displacement can accordingly be brought about by translation in the direction of the first coordinate (x) and/or in the direction of the second coordinate (y) and/or in the direction of the third coordinate (z) and/or by rotation about the first coordinate (x) and/or by rotation about the second coordinate (y) and/or by rotation about the third coordinate (z).

The illumination angle variation device can include at least one further illumination angle variation unit for generating at least one further deflection angle for the illumination light in the deflection plane perpendicular to the object displacement direction. The illumination angle variation units are arranged such that they successively influence the illumination light. In such an illumination angle variation device, by way of example, a first, constant deflection angle in the deflection plane perpendicular to the object displacement direction can be fixedly preset. This preset deflection angle can then be modulated via the displaceable illumination angle variation unit. The illumination light can be influenced firstly by the displaceable illumination angle variation unit or, in an alternative embodiment, also firstly by the further illumination angle variation unit. The two illumination angle variation units can be two lens elements at a mutually variable distance. The illumination angle variation units displaceable with respect to one another can also be wedge components displaceable transversely with respect to a beam path of the illumination light.

The further illumination angle variation unit can be a static unit. Such an embodiment is associated with comparatively little structural outlay. Variants for such a static illumination angle variation unit are described in WO 2007/093433 A1. Alternatively, it is possible to embody both illumination angle variation units as displaceable units. The explanation already given above is applicable with regard to the term "displaceability".

The further illumination angle variation unit can generate static deflection angles that are different in absolute terms in at least two angle variation portions. Such an embodiment makes possible a fine predefinition of an illumination parameter that is variable over the respective deflection angle.

The illumination angle variation device can also include more than two angle variation portions in which the illumination light is deflected differently in the deflection plane. A deflecting effect can also change continuously depending on the location of incidence of the illumination light on the illumination angle variation device.

A maximum deflection effect of the displaceable illumination angle variation unit can be smaller than a maximum deflection effect of the further illumination angle variation unit. Such a relative deflecting effect makes possible fine influencing of a total deflection effect via the displaceable illumination angle variation unit. This influencing can reside in an attenuation of the deflection effect of the further illumination angle variation unit in the deflection plane and/or in an amplification. It is also possible for the displaceable illumination angle variation unit, in one angle variation portion, to attenuate the deflection effect of the further illumination angle variation unit in the deflection plane and, in another angle variation portion, to amplify the deflection effect of the further illumination angle variation unit in the deflection plane. Alternatively, it is possible for the maximum deflection effect of the displaceable illumination angle variation unit to be greater than a maximum deflection effect of the further illumination angle variation unit.

Alternatively, the displaceable illumination angle variation unit can have the same maximum deflection effect as the further illumination angle variation unit. In a neutral position of the two illumination angle variation units with respect to one another, a mutual compensation of the deflection effects can then arise.

At least one of the illumination angle variation units can be a roof edge prism, a cylindrical lens component, a saddle surface component, an asphere surface component, a freeform surface component, a wedge body or a lens element. A roof edge prism embodiment is described for an illumination angle variation unit in WO 2007/093433 A1. The at least one illumination angle variation unit embodied as a roof edge prism can extend over an entire used aperture of the raster arrangement. In the case of a cylindrical lens element embodiment, the deflection effect of the at least one illumination angle variation unit embodied as a cylindrical lens element changes continuously. The at least one illumination angle variation unit embodied as a cylindrical lens element can also extend over the entire used aperture of the raster arrangement. The saddle surface component has in the circumferential direction around a center an alternating course between a wedge course tapering toward the edge and a wedge course tapering toward the center, wherein the change in the circumferential direction can take place e.g. in each case every 90°.

A wedge body as an illumination angle variation unit can be embodied as tapering toward the optical axis, that is to say toward the beam path of a central individual ray in the illumination beam path, or as tapering toward the outside.

Insofar as a plurality of illumination angle variation units are used, all the illumination angle variation units can be of the same type, that is to say can be embodied for example as roof edge prisms and/or as cylindrical lens elements. An embodiment of an illumination angle variation device is possible in which at least two illumination angle variation units are embodied as different types, for example a combination of a roof edge prism and a cylindrical lens element. Alternatively or additionally, one of the illumination angle variation devices or one of the illumination angle variation units can be embodied as an Alvarez manipulator, as described for example in WO 2009/141033 A1 and in EP 0 851 304 A.

The illumination angle variation device can be arranged upstream of the raster arrangement in the beam path of the illumination light. In particular nonlinear influences of the raster arrangement on an angle of incidence of the illumination light on the raster arrangement can then be utilized in a targeted fashion by a corresponding design of the illumination angle variation device.

The illumination angle variation device can alternatively or additionally be arranged in a field intermediate plane situated upstream of the illumination field in the beam path of the illumination light. The field intermediate plane can be arranged downstream of the raster arrangement in the beam path of the illumination light. An arrangement of the illumination angle variation device is therefore possible, for example, in which one illumination angle variation unit is arranged upstream of the raster arrangement in the beam path of the illumination light and another illumination angle variation unit is arranged in a field intermediate plane downstream of the raster arrangement in the beam path of the illumination light.

The illumination angle variation device can include two refractive optical plates each having at least one curved surface, the optical plates being arranged in a displaceable fashion relative to one another perpendicular to the beam path of the illumination light. It is also possible for both surfaces of the plates through which the illumination light passes to be embodied in a curved fashion.

The two refractive optical plates of the illumination angle variation device can be embodied as displaceable with respect to one another parallel to the object displacement direction and/or perpendicular to the object displacement direction. This displacement is effected in each case perpendicularly or transversely with respect to the beam path of the illumination light.

The two refractive optical plates can be embodied with curved surfaces having identical height profiles.

The two refractive optical plates of the illumination angle variation device can be embodied with curved surfaces facing one another such that, in exactly one relative displacement position of the two plates with respect to one another, there is an air gap of uniform size between the two optical plates.

A height profile of the curved surfaces can follow a polynomial function in the deflection plane perpendicular to the object displacement direction. The height profile can be parabolic, for example. Alternatively, the height profile of the curved surface of the refractive optical plate of the illumination angle variation device can follow a third-order polynomial in the deflection plane perpendicular to the object displacement direction.

The height profile of the curved surface of the refractive optical plate can be embodied in a wavy fashion in the deflection plane perpendicular to the object displacement direction, and follow a cosine function, for example.

A height profile of the curved surface of the refractive optical plate can have a linear or constant course in a plane perpendicular to the deflection plane.

The two refractive optical plates having curved surfaces facing one another can be embodied such that, in a relative displacement position of the two plates with respect to one another, there is an air gap between the two plates in the deflection plane, which air gap is maximal in a center of a beam of the illumination light and decreases monotonically and in particular linearly toward both sides toward the edge of the beam.

The two refractive optical plates having curved surfaces facing one another can be embodied such that, in a relative displacement position of the two plates with respect to one another, there is an air gap between the two plates perpendicular to the deflection plane, which air gap increases or decreases monotonically, strictly monotonically and in particular linearly from one edge of a beam of the illumination light toward the other edge of the beam of the illumination light.

In general, a course of a thickness of the air gap over the plate surface used by the beam of the illumination light is given by a difference of surface topographies of the plate surfaces bounding the air gap in a relative displacement position of the two plates. In this case, the gap thickness d can be written as:

$$d(x,y,a,b)=F_1(x,y)-F_2(x+a,y+b)$$

$F_1$ and $F_2$ are in this case the functions describing the topography of the respective plate surface; a is the relative displacement of the two plates with respect to one another in the x-direction; b is the relative displacement of the two plates with respect to one another in the y-direction; and x and y are the coordinates which span the plate surface used by the beam of the illumination light. x and y run perpendicular to the direction of propagation of the illumination light.

At least one of the illumination angle variation units can be a wedge body, wherein the following holds true for a gradient of a wedge edge region in a plane (xy) perpendicular to the beam direction (z) of the illumination light: $|dy/dx| \geq 2$, wherein y runs along the object displacement direction (y). Such a configuration of a wedge body avoids an undesirably strong deflection effect in a plane perpendicular to the deflection plane. This avoids undesirable channel crosstalk between different channels of the raster arrangement perpendicular to the deflection plane. The absolute value of the gradient $|dy/dx|$ can be at least 2.5 or at least 3 and can also be even greater.

The displaceable illumination angle variation unit can be pivotable about an optical axis of the illumination optical unit. Such an embodiment can be fashioned so that, apart from a desired variation of a total deflection effect of the illumination angle variation device, no further disturbing changes are introduced in the illumination-light-guiding effect of the illumination optical unit. The displaceable illumination angle variation unit can be embodied as, in particular, rotatable about the optical axis of the illumination optical unit. In particular a continuously variable change in the variation of a deflection by the illumination angle variation device can be achieved.

A displacement drive can be provided for displacing the at least one displaceable illumination angle variation unit with respect to the raster arrangement. Such a displacement drive makes possible an automated displacement of the displaceable illumination angle variation unit with respect to the raster arrangement. A displacement by the displacement drive can be effected along the beam direction of the illumination light. Alternatively or additionally, the displacement by the displacement drive can also be transverse with respect to the displacement direction, for example radial with respect to the optical axis of the illumination optical unit. The displacement drive can bring about a displacement in relation to at least one of the six possible degrees of freedom or else in relation to a plurality of degrees of freedom. The displacement drive can make possible, in particular, all displacement variants that have already been discussed above in relation to the term "displacement".

A measuring device can be provided for measuring an illumination parameter of the illumination light over the illumination field. Such a measuring device makes it possible to monitor the illumination parameter, for example to monitor an illumination angle distribution to be set, that is to say an illumination setting and to measure drift effects that may occur. By way of example, a telecentricity value in a dependent manner over at least one field dimension can be measured as the illumination parameter. A telecentricity value measuring device which can be used is described for example in DE 10 2005 026 628 A1 and in DE 10 2007 055 096 A1.

The measuring device can be signal-connected to the displacement drive via a control/regulating unit. Such an arrangement makes possible a regulated setting of the illumination angle variation device, such that, for example, an actual value of the measured illumination parameter can be tracked to a predefined desired value.

By way of example, a feedforward correction can be achieved with an illumination optical unit correspondingly including a measuring device, a control/regulating unit and a displacement drive. For this purpose, a preparatory calibration measurement is used to determine how an illumination parameter, for example a telecentricity value, changes over the illumination field in the case of this set illumination setting. As soon as a corresponding illumination setting is set during projection operation, the displaceable illumination angle variation unit is brought in a controlled manner to a position in which an illumination parameter to be corrected, for example the telecentricity value, is corrected in accordance with the change resulting from the calibration measurement in the case of the illumination setting being set. In the case of this operating mode "feedforward correction", it is not absolutely necessary for the measuring device to operate during projection operation. Moreover, it suffices if a control unit is used which is signal-connected to the displacement drive. A regulating function is not necessary.

Alternatively or additionally, a corresponding illumination optical unit including a measuring device, a control/regulating unit and a displacement drive can be used for regulated operation of the illumination optical unit. In this case, during production operation, an illumination parameter, for example a telecentricity value, is monitored by measuring device and readjusted via the control/regulating unit by corresponding adjustment of the displacement drive. For this purpose, an actual illumination parameter measured via the measuring device is compared with a predefined desired illumination parameter and a control signal for driving the displacement drive is generated depending on this comparison value.

Insofar as the illumination angle variation device includes two illumination angle variation units adjacent to one another and embodied as refractive optical plates, then the two plates can have curved surfaces facing one another. The surfaces facing away from one another can be embodied in a plane fashion. In variants of such illumination angle variation devices, the curved optical surfaces that are effective for the illumination angle variation can also be arranged in a manner facing away from one another. In further variants of the illumination angle variation device, the plane optical surfaces can be replaced by curved optical surfaces, for example by spherical surfaces. This can be used in particular in illumination angle variation units which do not experience displacement transversely with respect to the beam direction of the illumination light.

The advantages of an optical system including such an illumination optical unit, of a projection exposure apparatus including such an optical system, of a production method which includes using such a projection exposure device to produce a micro- or nanostructured component, and of such a micro- or nanostructured component correspond to those which have already been explained above with reference to the illumination optical unit according to the disclosure.

BRIEF DESCRIPTION OF THE DRAWINGS

Exemplary embodiments of the disclosure are explained in greater detail below with reference to the drawing, in which:

FIGS. 22-24 show three relative positions of the illumination angle variation device according to FIGS. 19 and 20 in a plan view, wherein FIG. 22 shows the relative position according to FIG. 19, FIG. 23 shows an intermediate relative position and FIG. 24 shows the relative position according to FIG. 20;

DETAILED DESCRIPTION

Figure 1:
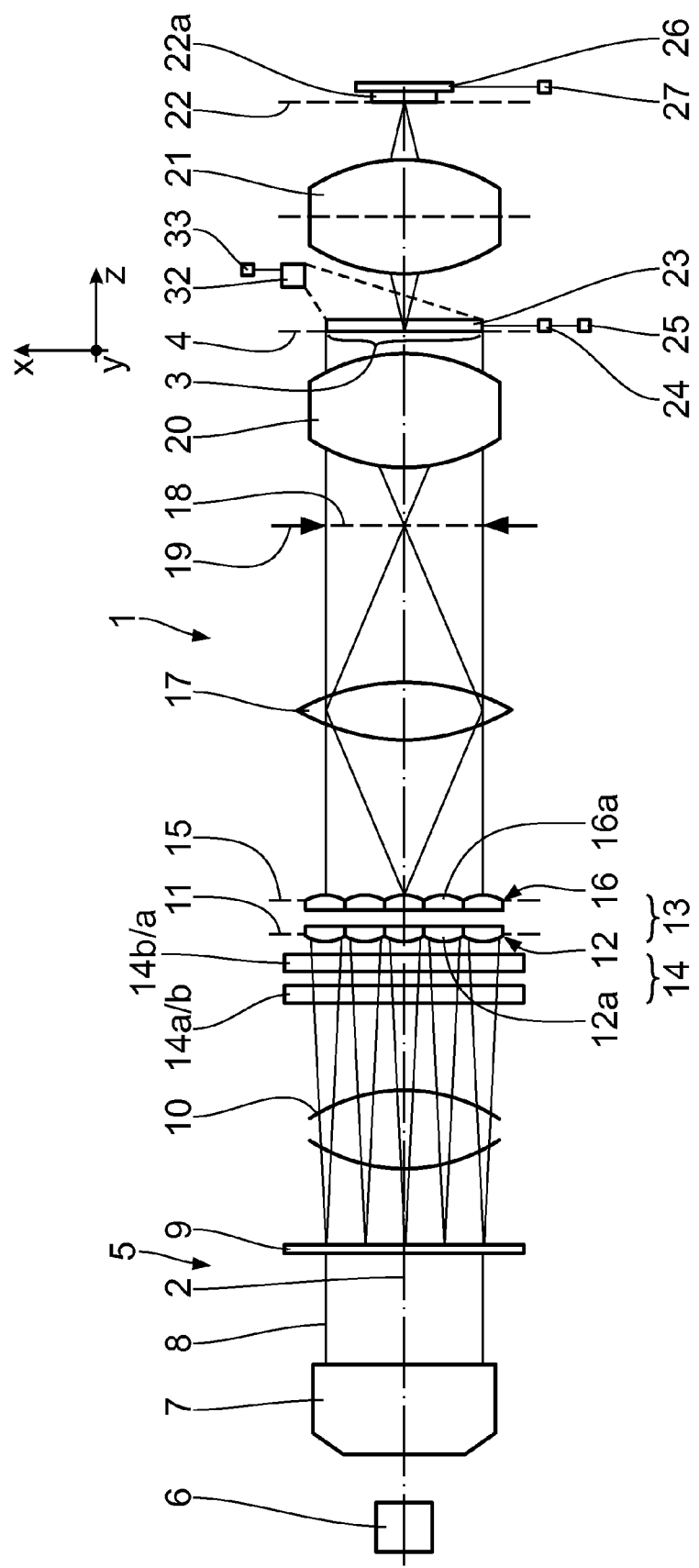
FIG. 1 schematically shows a meridional section through an illumination system according to the disclosure within a microlithography projection exposure apparatus including an illumination angle variation device upstream of a raster module including a two-stage raster arrangement.

FIG. 1 schematically shows a microlithography projection exposure apparatus 1 which is embodied as a wafer scanner and is used in the production of semiconductor components and other finely structured components. The projection exposure apparatus 1 operates with light from the vacuum ultraviolet range (VUV), in particular, in order to obtain resolutions down to fractions of micrometers.

In order to clarify positional relationships, a Cartesian xyz-coordinate system is used in the drawing. The x-direction runs upward in FIG. 1. The y-direction runs perpendicular to the plane of the drawing and out of the plane in FIG. 1. The z-direction runs toward the right in FIG. 1.

Figure 2:
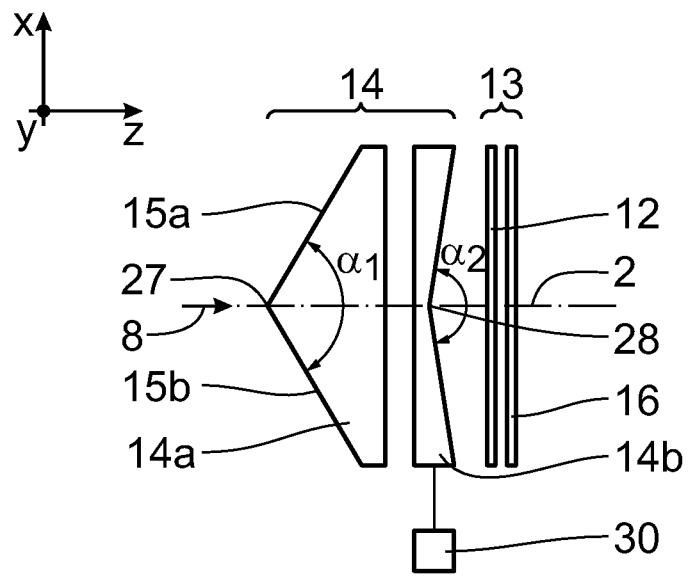
FIG. 2 schematically shows an excerpt from an illumination optical unit of the illumination system according to FIG. 1, wherein two illumination angle variation units of the illumination angle variation device are illustrated in a first relative position with respect to one another, in which the displaceable illumination angle variation unit, which influences illumination light guided via the illumination optical unit, in a deflection plane has a smaller and opposite deflection effect in comparison with the first illumination angle variation unit, wherein the two illumination angle variation units are embodied as roof edge prisms.

A scanning direction y of the projection exposure apparatus 1 runs perpendicular to the plane of the drawing in FIGS. 1 and 2. In the meridional section illustrated in FIG. 1, all the optical components of the projection exposure apparatus 1 are lined up along an optical axis 2 running along the z-direction. It goes without saying that it is also possible for the optical axis 2 to be folded in any desired manner, in particular in order to make the projection exposure apparatus 1 compact. In the subsequent figures, too, unless explained otherwise, the x-axes run parallel to the x-axis according to FIG. 1 and the y-axes run parallel to the y-axis according to FIG. 1.

An illumination optical unit of an illumination system of the projection exposure apparatus 1, the illumination system being designated in its entirety by 5, serves for the defined illumination of an object field or illumination field 3 in a reticle plane 4, in which a structure to be transferred in the form of a reticle (not illustrated in more specific detail) is arranged. An $F_2$ laser having an operating wavelength of 157 nm serves as a primary light source 6, the illumination light beam of the laser being aligned coaxially with the optical axis 2. Other UV light sources, for example an ArF excimer laser having an operating wavelength of 193 nm, a KrF excimer laser having an operating wavelength of 248 nm, and primary light sources having longer or shorter operating wavelengths, are likewise possible.

The light beam coming from the light source 6 and having a small rectangular cross section is firstly incident on a beam expanding optical unit 7, which generates an emerging beam 8 having substantially parallel light and larger rectangular cross section. The beam expanding optical unit 7 can contain elements which serve for reducing the coherence of the illumination light. The laser light substantially parallelized by the beam expanding optical unit 7 is subsequently incident on a diffractive optical element (DOE) 9, which is embodied as a computer generated hologram for generating an illumination light angle distribution. The angle distribution generated by the DOE 9, upon passing through a Fourier lens element arrangement or a condenser 10, which is positioned at the distance of its focal length from the DOE 9, is converted into a two-dimensional illumination light intensity distribution, that is to say an illumination light intensity distribution that is location-dependent perpendicular to the optical axis 2. The intensity distribution thus generated is therefore present in a first illumination plane 11 of the illumination system 5. Together with the condenser 10, the DOE 9 therefore constitutes a light distribution device for generating a two-dimensional illumination light intensity distribution.

A first raster arrangement 12 of a raster module 13 is arranged in the region of the first illumination plane 11, the raster module also being designated as a fly's eye condenser. Together with an illumination angle variation device 14 arranged upstream of the raster module 13 in the light path, the raster module 13 serves for generating a defined intensity and illumination angle distribution of the illumination light. The illumination angle variation device 14 influences the deflection angle of the illumination light beam 8. The illumination angle variation device 14 includes two illumination angle variation units 14a, 14b, which are impinged on successively by the illumination light beam 8. The optical effect of the illumination angle variation device 14 is explained in even greater detail below on the basis of various exemplary embodiments.

A second raster arrangement 16 is arranged in a further illumination plane 15, which is a Fourier-transformed plane with respect to the illumination plane 11. The two raster arrangements 12, 16 constitute the fly's eye condenser 13 of the illumination system 5. The further illumination plane 15 is a pupil plane of the illumination system 5.

Disposed downstream of the raster module 13 is a further condenser 17, which is also designated as a field lens element. Together with the second raster arrangement 16, the condenser 17 images the illumination plane 11 into a field intermediate plane 18 of the illumination system 5. A reticle masking system (REMA) 19 can be arranged in the field intermediate plane 18, and serves as an adjustable shading stop for generating a sharp edge of the illumination light intensity distribution. A downstream lens 20 images the field intermediate plane 18 onto the reticle, that is to say the lithography original, situated in the reticle plane 4. Via a projection lens 21, the reticle plane 4 is imaged onto a wafer plane 22 onto a wafer 22a, which is displaced intermittently or continuously in the scanning direction y.

The first raster arrangement 12 has individual first raster elements 12a arranged in columns and rows. The first raster elements 12a have a rectangular aperture having an x/y aspect ratio (y: scanning direction) of 2/1, for example. Other, in particular higher, aspect ratios of the first raster elements 12a are also possible.

The meridional section according to FIG. 1 passes along a raster column. The first raster elements 12a are embodied in particular as microlens elements, e.g. having a positive refractive power. The rectangular shape of the first raster elements 12a corresponds to the rectangular shape of the illumination field 3. The first raster elements 12a are arranged in a manner directly adjoining one another, that is to say substantially in an area-filling manner, in a raster corresponding to their rectangular shape. The first raster elements 12a are also designated as field honeycombs.

In a manner respectively assigned to the channels, second raster elements 16a of the second raster arrangement 16 are arranged in the light path downstream of the first raster elements 12a of the first raster arrangement 12. The second raster elements 16a are likewise embodied as microlens elements having, in particular, a positive refractive power. The second raster elements 16a are also designated as pupil honeycombs arranged in the illumination plane 15, that is to say in a pupil plane of the illumination system 5. The illumination plane 15 is conjugate with respect to a pupil plane of the projection lens 21. The second raster elements 16a together with the field lens element 17 image the first raster elements 12a arranged in the illumination plane 11, that is to say the field honeycombs, into the field intermediate plane 18. In this case, the images of the first raster elements 12a are superimposed in the field intermediate plane 18.

For mounting a reticle 23, which is illustrated schematically in FIG. 1, in the reticle plane 4, use is made of an object holder 24, which is likewise illustrated schematically and which is displaceable in the scanning direction y via an object displacement drive 25. The wafer 22a is carried by a wafer holder 26, which is in turn displaceable in the scanning direction y via a wafer displacement drive 27. Both displacement drives 25, 27 can also bring about a displacement of the holders 24, 26 perpendicular to the scanning direction, that is to say in the x-direction according to FIG. 1, transversely with respect to the beam direction of the illumination light 8.

A first embodiment for the illumination angle variation device 14 is described below with reference to FIGS. 2 to 5. The raster arrangements 12, 16 of the raster module 13, if illustrated at all, are merely represented highly schematically in FIG. 2 et seq.

The illumination angle variation device 14 according to FIGS. 2 to 5 includes two illumination angle variation units 14a, 14b, each embodied as roof edge prisms, the roof edges 27, 28 of which run parallel to the y-axis, that is to say parallel to the scanning direction. The roof edge prism embodiment extends over an entire used aperture of the raster module 13. The illumination angle variation unit 14a through which the illumination light beam 8 passes first is embodied as a convex roof edge prism and the downstream illumination angle variation unit 14b is embodied as a concave roof edge prism. The illumination angle variation unit 14a through which the illumination light 8 passes first is embodied as a static unit. The downstream illumination angle variation unit 14b is embodied as a displaceable illumination angle variation unit, as will be described below. The roof edge 27 of the illumination angle variation unit 14a faces the incident illumination light beam 8. The roof edge 27, which constitutes the highest elevation of an entrance surface of the first illumination angle variation unit 14a, is therefore reached first by the illumination light 8. An exit surface of the static illumination angle variation unit 14a, through which the illumination light 8 passes first, is realized as a plane surface just like an entrance surface of the displaceable illumination angle variation unit 14b, through which the illumination light 8 passes subsequently. An exit surface of the displaceable illumination angle variation unit 14b has the roof edge 28, which simultaneously constitutes the region of the illumination angle variation unit 14b having a smallest material thickness.

The illumination angle variation units 14a, 14b constitute refractive units, that is to say are transmissive to the illumination light beam 8. The illumination angle variation units 14a, 14b are composed of material that is highly transmissive to VUV light wavelengths.

In a further embodiment (not illustrated), the illumination light 8 passes firstly through the displaceable illumination angle variation unit 14b and then through the static illumination angle variation unit 14a. The two illumination angle variation units 14a, 14b therefore interchange their places in comparison with the embodiments illustrated by way of example according to FIGS. 2 to 5.

In a further embodiment (not illustrated), the static illumination angle variation unit 14a can also be completely omitted. The illumination angle variation device 14 then exclusively includes at least one displaceable illumination angle variation unit.

A first roof surface 15a of the static illumination angle variation unit 14a constitutes an angle variation portion on account of its deflecting refractive effect for the illumination light 8. A second roof surface 15b correspondingly constitutes a further angle variation portion of the static illumination angle variation unit 14a.

A smallest angle $\alpha_1$ which the two entrance surface portions 15a, 15b of the illumination angle variation unit 14a which adjoin the roof edge 27 assume with respect to one another is smaller than a corresponding smallest angle $\alpha_2$ which the two entrance surface portions of the illumination angle variation unit 14b which adjoin one another via the roof edge 28 assume with respect to one another. A refractive, deflecting effect of the static illumination angle variation unit 14a is therefore greater than a corresponding deflecting effect of the downstream displaceable illumination angle variation unit 14b. Alternatively, embodiments are also possible in which a refractive, deflecting effect of the static illumination angle variation unit 14a is less than a corresponding deflecting effect of the downstream displaceable illumination angle variation unit 14b.

On account of the roof edge subdivision of the two illumination angle variation units 14a, 14b, the latter deflect the illumination light beam 8 incident on the illumination angle variation device 14 in the two angle variation portions, corresponding to the two surface portions 15a, 15b adjoining one another via the roof edges 27, 28, in a respective deflection plane xz with different deflection angles.

Figure 4:
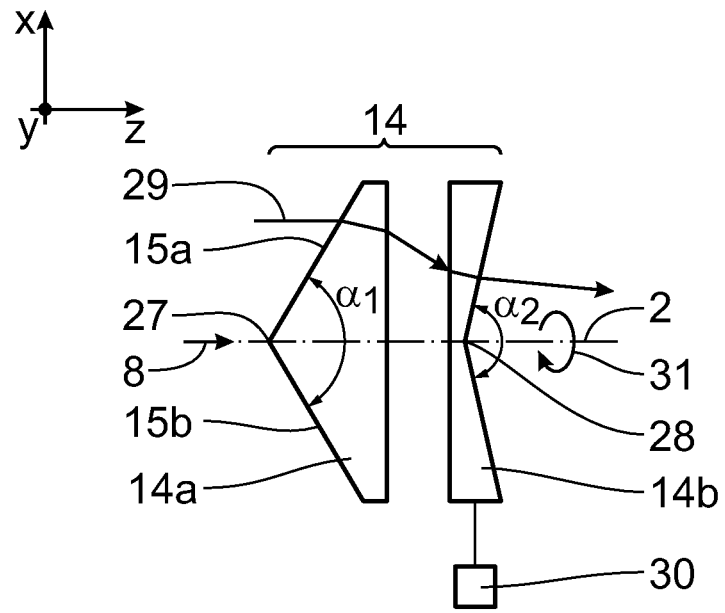
FIGS. 4 and 5 schematically show a deflecting effect of the illumination angle variation device including the illumination angle variation units in the relative positions according to FIGS. 2 and 3.

In the relative position of the two illumination angle variation units 14a, 14b which is illustrated in FIGS. 2 and 4, this deflection is effected in each case in the deflection plane xz perpendicular to the object displacement direction y. This is illustrated on the basis of the example of an individual ray 29 of the illumination light beam 8 in FIG. 4. In principle, depending on the relative position of the two illumination angle variation units 14a, 14b with respect to one another, a deflection can also be effected in a yz plane perpendicular thereto, but this is of no further interest for the following explanation.

On account of the larger roof edge angle $\alpha_2$ of the displaceable illumination angle variation unit 14b in comparison with the static illumination angle variation unit 14a, the displaceable illumination angle variation unit 14b generates a smaller maximum deflection effect than the static illumination angle variation unit 14a. This is also illustrated in FIG. 4, where the individual ray 29 enters the static illumination angle variation unit 14a in a manner running parallel to the z-axis. A propagation angle of the individual ray 29 with respect to the z-axis is greater between the two illumination angle variation units 14a, 14b than after emergence from the displaceable illumination angle variation unit 14b. In an alternative embodiment (not illustrated), a propagation angle of the individual ray 29 with respect to the z-axis can also be smaller between the two illumination angle variation units 14a, 14b than after emergence from the displaceable illumination angle variation unit 14b.

The displaceable illumination angle variation unit 14b is embodied as rotatable or pivotable about the optical axis 2 of the illumination optical unit of the illumination system 5 via a displacement drive 30, as illustrated schematically with the aid of a direction arrow 31 in FIG. 4.

Via the displacement drive 30, the displaceable illumination angle variation unit 14b can be pivoted by at least 90° about the optical axis 2.

Figure 3:
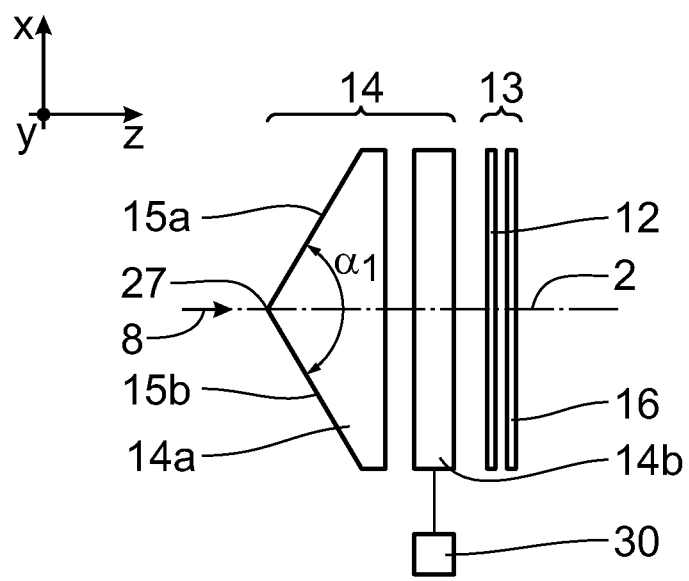
FIG. 3 shows the illumination angle variation device according to FIG. 2 with a relative positioning of the two illumination angle variation units with respect to one another in which the displaceable illumination angle variation unit is present in a neutral position in the deflection plane illustrated, that is to say has no deflection effect on the illumination light.

FIG. 3 shows a relative position of the two illumination angle variation units 14a, 14b with respect to one another in which the displaceable illumination angle variation unit 14b is pivoted by 90° about the optical axis 2 in comparison with the relative position according to FIG. 2. In the relative position according to FIG. 3, the roof edge 28, which is not visible in FIG. 3, therefore runs parallel to the x-axis.

Figure 5:
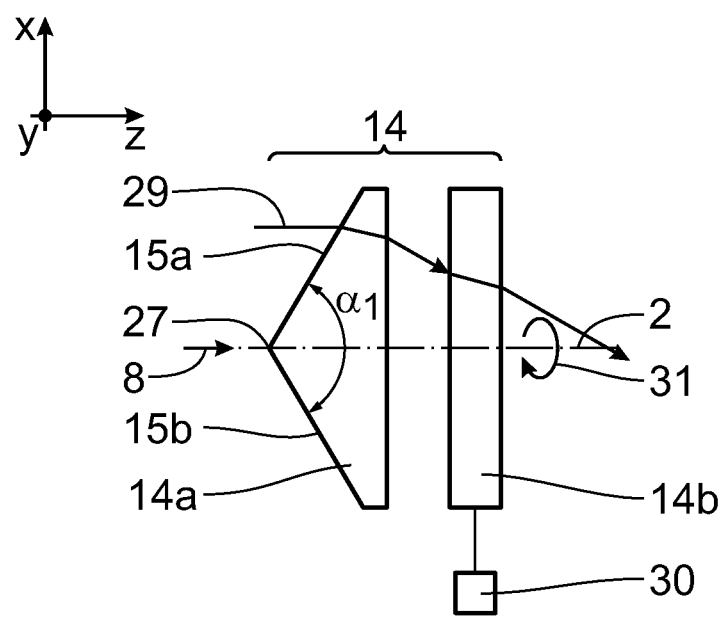

In the deflection plane xz, that is to say in the plane of the drawing in FIG. 3, in the relative position according to FIG. 3, the displaceable illumination angle variation unit 14b has no effect, that is to say does not lead to any deflection of the illumination light beam 8. Correspondingly, the illumination light beam 8 after passing through the illumination angle variation device 14 in the relative position according to FIG. 3 has in the deflection plane xz a deflection angle corresponding to the deflection angle between the two illumination angle variation units 14a, 14b. Since the deflection-attenuating effect of the displaceable illumination angle variation unit 14b is omitted in the relative position according to FIG. 3, the deflecting effect of the static illumination angle variation unit 14a in the relative position according to FIG. 3 in the deflection plane xz is therefore greater than in the relative position according to FIG. 2. This deflection behavior is illustrated in FIG. 5.

Between the maximally deflecting effective position of the displaceable illumination angle variation unit 14b according to FIG. 2 and the neutral position of the displaceable illumination angle variation unit 14b according to FIG. 3, all possible intermediate deflection effects of the displaceable illumination angle variation unit 14b in the deflection plane xz can be set in a continuously variable fashion. For this purpose, the displaceable illumination angle variation unit 14b is pivoted by an angle in the range of between 0° and 90° about the optical axis 2 proceeding from the relative position according to FIG. 2, for example, with the aid of the displacement drive 30.

FIG. 1 schematically also illustrates a measuring device 32 for measuring an illumination parameter of the illumination light, that is to say of the illumination light beam 8, over the illumination field 3. The measuring device 32 can be used to measure, for example, the illumination parameter depending on a set illumination angle distribution over the illumination field 3, that is to say depending on a set illumination setting. Alternatively or additionally, the measuring device 32 can measure an illumination parameter depending on temporal drift effects of the projection exposure apparatus 1.

By way of example, a telecentricity value T depending on an illumination field dimension x perpendicular to the scanning direction y serves as the illumination parameter to be measured. The illumination field dimension x perpendicular to the scanning direction y is also designated as the field height.

The telecentricity value T is defined as follows for a given illumination setting:

$$T(x) = \frac{\sum_{n=1}^{N}(I_n(x) \cdot \vec{p}_n)}{r_{NA} \sum_{n=1}^{N} I_n(x)}$$

In this case:

n denotes: number of the respectively considered illumination pole of the illumination setting;

N denotes: number of illumination poles of the illumination setting considered;

$I_n(x)$ denotes: intensity of the illumination pole n at the field location x (field height). This intensity is the total intensity after integration over the scanning or object displacement direction y over the illumination field 3 or an image field in the wafer plane 22;

$\vec{p}_n(x)$ denotes: intersection point of a beam of the illumination pole n at the field location x through a pupil plane of the illumination system. This vector is accordingly two-dimensional.

$r_{NA}$ denotes: radius of the pupil stop in the pupil plane considered above.

The telecentricity value T is an energetic telecentricity. T(x) represents a measure of the entire centroid ray of the illumination including a plurality of illumination poles, depending on a field position x.

The measuring device 32 is signal-connected to the displacement drive 30 via a control/regulating unit 33 in a manner not illustrated more specifically. A measuring device known from DE 10 2005 026 628 A1 or DE 10 2007 055 096 A1 for example, can be used as a telecentricity measuring device.

A further embodiment for the illumination angle variation device 14 is explained below with reference to FIGS. 6 and 7. Components corresponding to those which have already been discussed above with reference to FIGS. 1 to 5 bear the same reference numerals and will not be explained in detail again.

Figure 6:
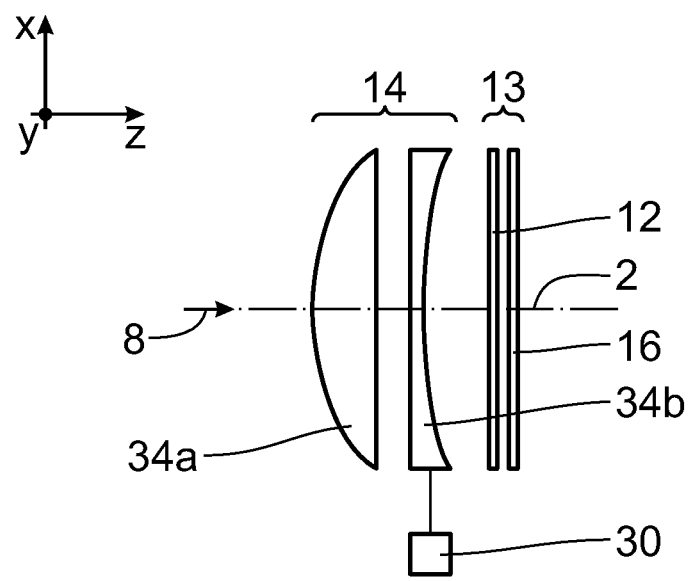
FIG. 6 shows, in an illustration similar to FIG. 2, a further variant of an illumination angle variation device upstream of the raster module, wherein the illumination angle variation units are embodied as cylindrical lens elements having refractive surfaces shaped in an elliptically curved fashion.
Figure 7:
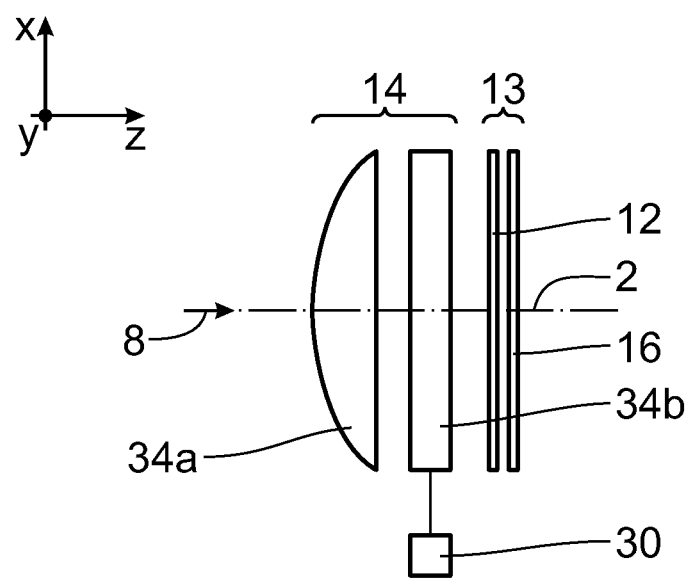
FIG. 7 shows the illumination angle variation device according to FIG. 6 in a relative position of the illumination angle variation units according to FIG. 3, that is to say with a neutral displaceable illumination angle variation unit.

In the case of the embodiment according to FIGS. 6 and 7, a static illumination angle variation unit 34a, which can be used instead of the illumination angle variation unit 14a, is embodied as a planoconvex cylindrical lens having a convex entrance surface and plane exit surface for the illumination beam 8. A displaceable illumination angle variation unit 34b, which can be used instead of the illumination angle variation unit 14b, is embodied as a planoconcave cylindrical lens having a plane entrance surface and a concave exit surface. The convex entrance surface of the illumination angle variation unit 34a has an approximately elliptical shape. The concave exit surface of the illumination angle variation unit 34b has an approximately elliptical shape. A different shaping of the static illumination angle variation unit 34a and/or of the displaceable illumination angle variation unit 34b is also possible instead of an elliptical shape. In the plane perpendicular to the cylinder axis, the entrance and/or exit surfaces can be fashioned spherically, aspherically or as freeform surfaces, that is to say as one-dimensional freeform surfaces.

A radius of curvature of the convex entrance surface of the illumination angle variation unit 34a in the region of the optical axis 2 is less than a radius of curvature of the concave exit surface of the illumination angle variation unit 14b, likewise in the region of the optical axis 2. Overall, the displaceable illumination angle variation unit 34b has a smaller refractive deflecting effect on the illumination light beam 8 than the static illumination angle variation unit 34a. In a variant that is not illustrated, the displaceable illumination angle variation unit 34b has a greater refractive deflecting effect on the illumination light beam 8 than the static illumination angle variation unit 34a.

On account of the convex shape of the entrance surface of the illumination angle variation unit 34a, the deflecting effect thereof on the parallel incident individual rays of the illumination beam 8 is all the greater, the further away from the optical axis 2 the individual rays are incident on the illumination angle variation unit 34a. The same correspondingly applies to the displaceable illumination angle variation unit 34b.

FIG. 6 shows the two illumination angle variation units 34a, 34b in a relative position corresponding to that of the two illumination angle variation units 14a, 14b in the embodiment according to FIG. 2. In this relative position, the displaceable illumination angle variation unit 34b attenuates the deflection angles generated by the static illumination angle variation unit 34a.

FIG. 7 once again shows the relative position between the two illumination angle variation units 34a, 34b in which the displaceable illumination angle variation unit 34b is pivoted by 90° about the optical axis 2 with the aid of the displacement drive 30. In the neutral position illustrated in FIG. 7, the illumination angle variation unit 34b has no effect in the deflection plane xz.

The illumination angle variation units 14a, 14b or 34a, 34b can also be arranged in a manner interchanged in their order in which they influence the illumination light beam 8. This is indicated schematically in FIG. 1, where the reference sign assignment is such that either an order 14a, 14b or an order 14b, 14a is specified for the arrangement of the illumination angle variation units within the illumination angle variation device 14.

A further embodiment of an illumination angle variation device 14 is explained below with reference to FIGS. 8 and 9. Components and functions corresponding to those which have already been explained above with reference to FIGS. 1 to 7, and in particular with reference to FIGS. 1 to 5, bear the same reference numerals and will not be discussed in detail again.

Figure 8:
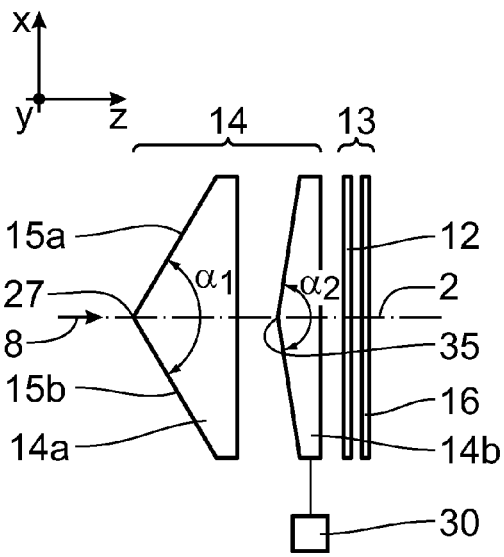
FIG. 8 shows, in an illustration similar to FIG. 2, a further embodiment of an illumination angle variation device including illumination angle variation units embodied as roof edge prisms, wherein the displaceable illumination angle variation unit, through which the illumination light passes, has a smaller absolute deflection effect than the further illumination angle variation unit, and wherein the deflection effects of the two illumination angle variation units reinforce one another.
Figure 9:
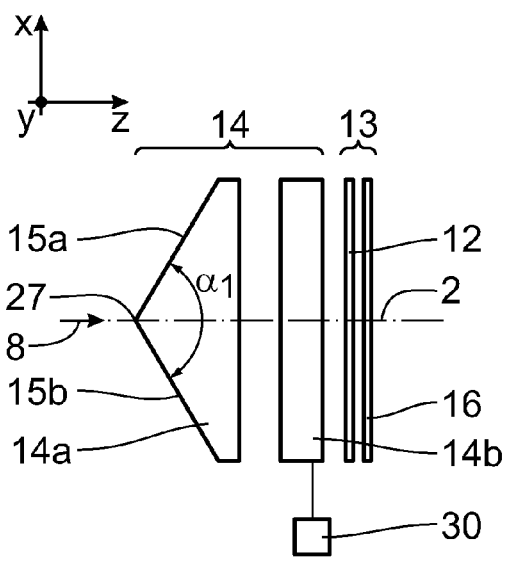
FIG. 9 shows, in an illustration similar to FIG. 3, the illumination angle variation device according to FIG. 8 with the displaceable illumination angle variation unit in a neutral position.

In the case of the embodiment according to FIGS. 8 and 9, the displaceable illumination angle variation unit 14b is embodied likewise, like the illumination angle variation unit 14a, as a roof edge prism having a convex entrance surface with roof edge 35. A roof edge angle $\alpha_1$ between the mutually adjoining entrance surface portions of the illumination angle variation unit 14a according to FIGS. 8 and 9 is less than the roof edge angle $\alpha_2$ of the illumination angle variation unit 14b. Correspondingly, the illumination angle variation unit 14b according to FIGS. 8 and 9 has a smaller refractive deflecting effect on the illumination light beam 8 than the static illumination angle variation unit 14a. This deflecting effect is amplifying in the relative position according to FIG. 8, in which the two roof edges 27, 35 run parallel to one another, in contrast to the deflecting effect of the illumination angle variation unit 14b according to FIGS. 1 to 5. A deflection angle of an individual ray of the illumination light 8 in the relative position according to FIG. 8 is therefore greater downstream of the illumination angle variation unit 14b than between the two illumination angle variation units 14a, 14b.

FIG. 9 once again shows a neutral position of the illumination angle variation unit 14b, in which the latter is pivoted by 90° about the optical axis 2 with the aid of the displacement drive 30 in comparison with the relative position according to FIG. 8.

A further embodiment of an illumination angle variation device 14 is explained below with reference to FIGS. 10 and 11. Components and functions corresponding to those which have already been explained above with reference to FIGS. 1 to 9, and in particular with reference to FIGS. 1 to 7, bear the same reference numerals and will not be discussed in detail again.

Figure 10:
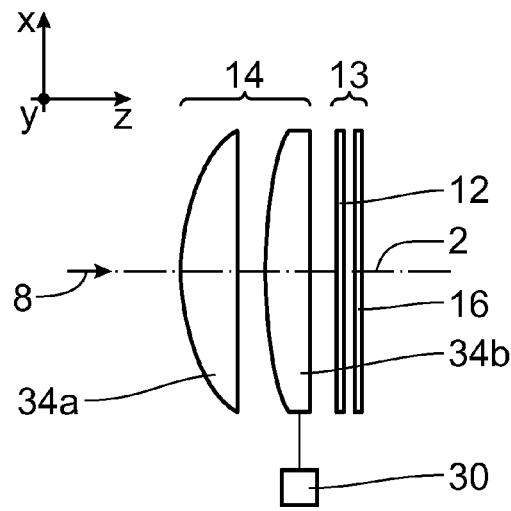
FIG. 10 shows, in an illustration similar to FIG. 8, a further embodiment of an illumination angle variation device, wherein the illumination angle variation units are once again embodied as cylindrical lens elements, wherein the further illumination angle variation unit has a stronger deflection effect in comparison with the displaceable illumination angle variation unit, and wherein the deflection effects of the two illumination angle variation units reinforce one another.
Figure 11:
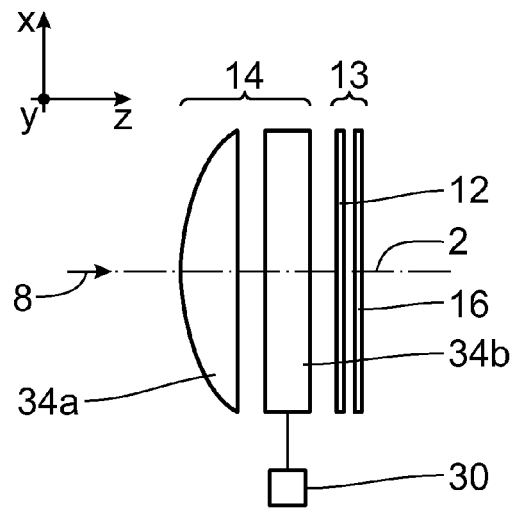
FIG. 11 shows, in an illustration similar to FIG. 3, the illumination angle variation device according to FIG. 10 with the displaceable illumination angle variation unit in a neutral position.

In the case of the embodiment according to FIGS. 10 and 11, the displaceable illumination angle variation unit 34b, just like the static illumination angle variation unit 34a, is embodied as a planoconvex cylindrical lens having a convex entrace surface and plane exit surface. A radius of curvature of the displaceable illumination angle variation unit 34b is greater than a radius of curvature of the static illumination angle variation unit 34a. For an individual ray of the illumination light beam 8 which is incident on the illumination angle variation device 14 according to FIG. 10 parallel to the optical axis 2 at a positive distance from the optical axis 2, the static illumination angle variation unit 34a therefore has a more strongly deflecting refractive effect than the displaceable illumination angle variation unit 34b.

FIG. 10 shows the illumination angle variation device 14 including the illumination angle variation units 34a, 34b in the relative position amplifying the deflecting effects in the deflection plane xz.

FIG. 11 shows the relative position with the displaceable illumination angle variation unit 34b in the neutral position.

Figure 12:
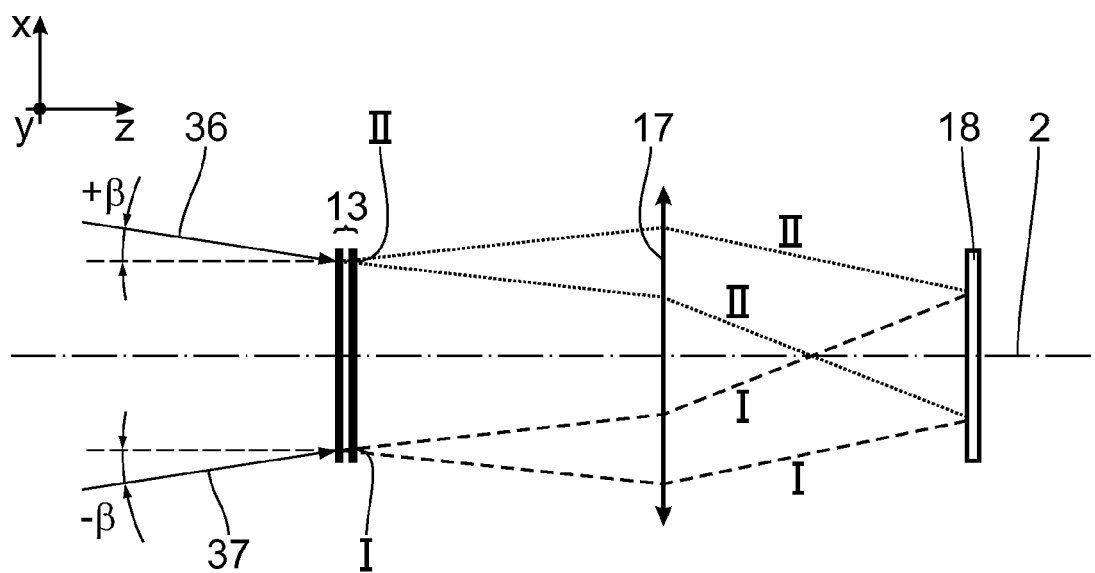
FIG. 12 schematically shows the raster module according to FIG. 1 and a downstream transfer optical unit for transferring the illumination light from the raster module into an illumination field, illustrated on the basis of the example of a field intermediate plane.
Figure 13:
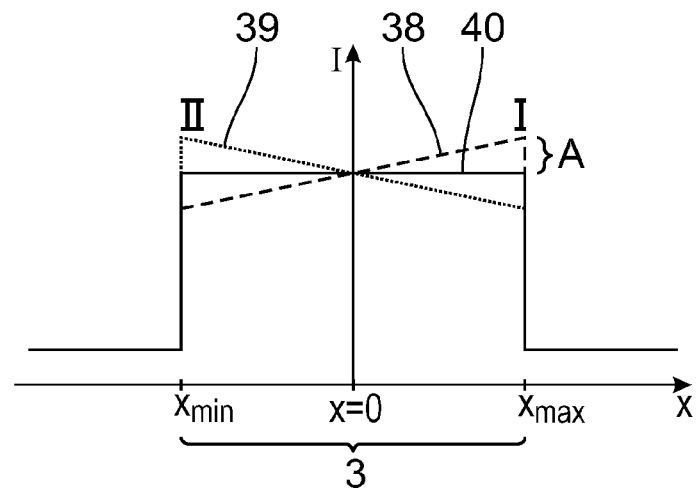
FIG. 13 shows in greater detail the illumination-field-dependent illumination angle intensity distributions generated by two channels illustrated in FIG. 12 in the illumination field.
Figure 14:
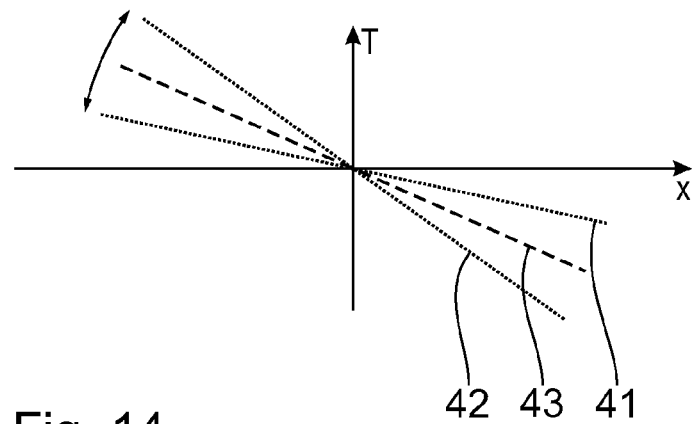
FIG. 14 shows variants of a telecentricity value over a field height of the illumination field, which are settable depending on a relative positioning of the two illumination angle variation units of the illumination angle variation device according to FIG. 1.

With reference to FIGS. 12 to 14, the possibility for setting the illumination parameter telecentricity with the aid of the illumination angle variation device 14 is explained on the basis of the example of the embodiment according to FIGS. 1 to 5. On account of the deflecting effect of the illumination angle variation device 14, an upper individual ray 36 in FIG. 12 is incident on the raster module 13 with a for example positive deflection angle $\beta$ relative to the z-axis and an individual ray 37 illustrated at the bottom in FIG. 12 is incident on the raster module 13 with a negative deflection angle $\beta$—mirror-inverted with respect thereto—with respect to the z-axis, that is to say with respect to the optical axis 2. These deflection angles are depicted as $+\beta$ and $-\beta$ in FIG. 12.

The individual ray 36 provides for an illumination in the field intermediate plane 18 from the direction of an illumination pole designated by II in FIG. 12. Correspondingly, the individual ray 37 provides for an illumination from the direction of an illumination pole designated by I in FIG. 12.

On account of the different deflecting effect +β/−β, for the two poles I, II this results in a different illumination intensity I against the field height (field dimension x), which is illustrated in FIG. 13. For the illumination pole I, an intensity profile 38 results in which the intensity rises linearly to a first approximation as the field height increases. For the illumination pole II, an opposite intensity profile 39 results in which the illumination intensity falls as the field height increases. Since the two intensity profiles 38, 39 have the same absolute value of the gradient, a total intensity profile 40 results which is independent of the field height.

The intensity profiles 38 to 40 are measured against the entire field height of the illumination field 3. An intensity difference A at the field edge ($x=x_{min}$ or $x=x_{max}$) with respect to an intensity in the field center ($x=0$) is designated as the amplitude A of the field profile. The following holds true:

$$A = |I(x=0) - I(x_{min/max})|$$

On account of the intensity profiles 38, 39, a telecentricity profile illustrated in FIG. 14 results, depending on the deflection angle β. In the case of the deflection angle +/−β according to FIG. 12, corresponding to the relative position of the illumination angle variation units 14a, 14b according to FIG. 2, this results in a telecentricity profile 41 having a minimum gradient against the field height. In the neutral position according to FIG. 3, in which a maximum deflection angle β can be generated, this results in a telecentricity profile 42 having a maximum gradient against the field height. In the case of an intermediate position of the displaceable illumination angle variation unit 14b between the positions according to FIGS. 2 and 3, this results in a medium telecentricity profile 43 having a medium gradient against the field height. Depending on the pivoting position of the displaceable illumination angle variation unit 14b about the optical axis 2, a telecentricity profile which can be set between the extremal telecentricity profiles 41, 42 in a continuously variable manner therefore results.

In the case of the embodiments described above, deflection angles +/−β in the deflection plane xz with an identical absolute value are generated with the aid of the illumination angle variation units 14a, 14b or 34a, 34b. In the angle variation portions corresponding to the roof surfaces 15a, 15b of the embodiment according to FIGS. 1 to 5, however, different absolute deflection angles can also be generated. The absolute inclinations of the roof surfaces of the roof edge prisms which were described above in connection with the various embodiments can therefore deviate from one another.

A further embodiment of an illumination angle variation device 44a as part of a further embodiment of an illumination optical unit for the projection exposure apparatus 1 according to FIG. 1 is explained below with reference to FIGS. 15 to 18. Components and functions corresponding to those which have already been explained above with reference to FIGS. 1 to 14 bear the same reference numerals and will not be discussed in detail again. The raster elements 12a, 16a of the raster arrangements 12, 16 are illustrated as round in the schematic illustration according to FIG. 15.

Figure 15:
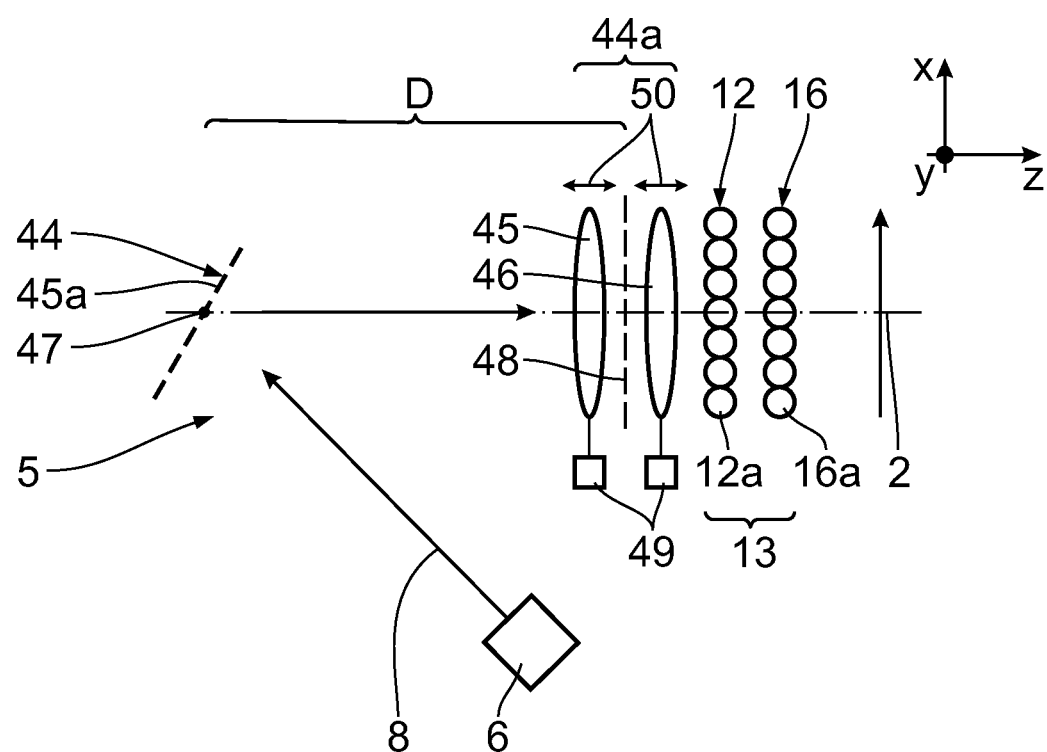
FIG. 15 shows highly schematically a meridional section through a further embodiment of an illumination optical unit which can be used instead of the illumination optical unit according to FIG. 1, illustrated between a light source and a raster module including a two-stage raster arrangement.

The illumination optical unit according to FIG. 15 has a micro-mirror array (multi-mirror array, MMA) 44 instead of the diffractive optical element 9. The MMA 44 has a multiplicity of mutually independently tiltable individual mirrors 45a. Via the individual mirrors 45a, the illumination light beam 8 incident on the MMA 44 is split into a multiplicity of partial beams and a predefined intensity distribution is generated at the location of the first raster arrangement 12 of the raster module 13. The raster module 13 then converts the intensity distribution into an illumination angle distribution firstly in the field intermediate plane 18 (cf. FIG. 1) and later in the object field 3. An illumination setting of the illumination system 5 according to FIG. 15 can therefore be generated via the MMA 44. The optical axis 2 is defined as the connecting axis between a center 47 of the MMA 44 and a center of an aperture of the raster module 13. With regard to further details of this MMA embodiment of an illumination system, reference is made to WO 2011/157601 A2.

The illumination optical unit according to FIG. 15 has the illumination angle variation device 44a in the form of a pupil lens element module between the MMA 44 and the raster module 13. The pupil lens element module includes two pupil lens elements 45, 46 having focal lengths $f_1$ and $f_2$. A combined focal length f of the pupil lens element module 44a according to FIG. 15 results as $$f = \frac{f_1 f_2}{f_1 + f_2 - e}$$

e here is the distance between the two pupil lens elements 45, 46.

The effective focal length f can be varied between two focal lengths $f_{min}$ and $f_{max}$ by variation of the distance e, wherein the following holds true: $f_{min} < D < f_{max}$, wherein D is the distance between the center 47 of the MMA 44 and an optical principal plane 48 of the pupil lens element module 44a.

For predefining the distance e, the pupil lens elements 45, 46 are in each case connected to a displacement actuator 49, which bring about a displacement of the pupil lens elements 45, 46 independently of one another along the optical axis 2 (cf. double-headed arrows 50 in FIG. 15). Alternatively, it is possible to equip only one of the two pupil lens elements 45, 46 with a corresponding displacement actuator 49.

Figure 16:
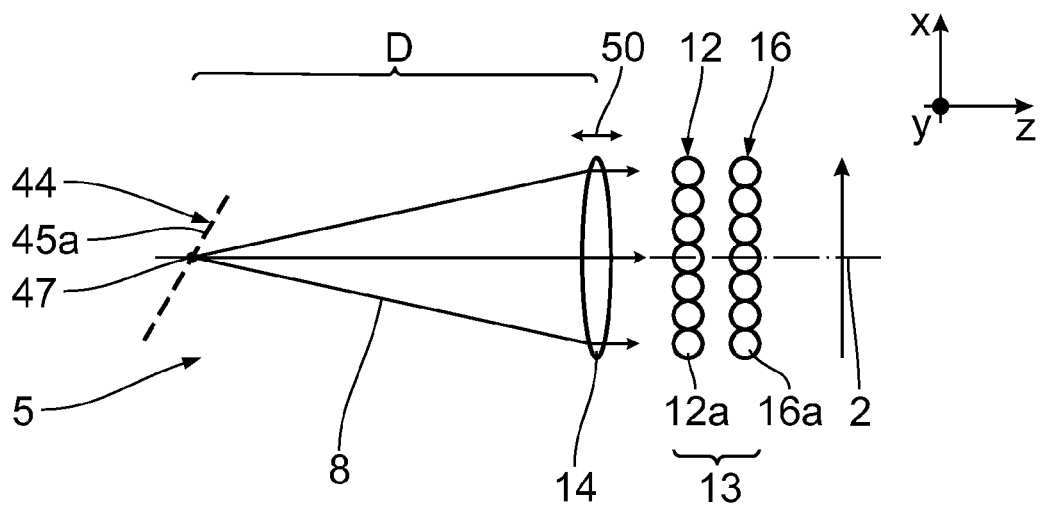
FIGS. 16-18 show, in an illustration similar to FIG. 15, setting variants of the illumination optical unit according to FIG. 15, wherein an illumination angle variation device including two lens elements is illustrated schematically in a manner combined as one lens element.
Figure 17:
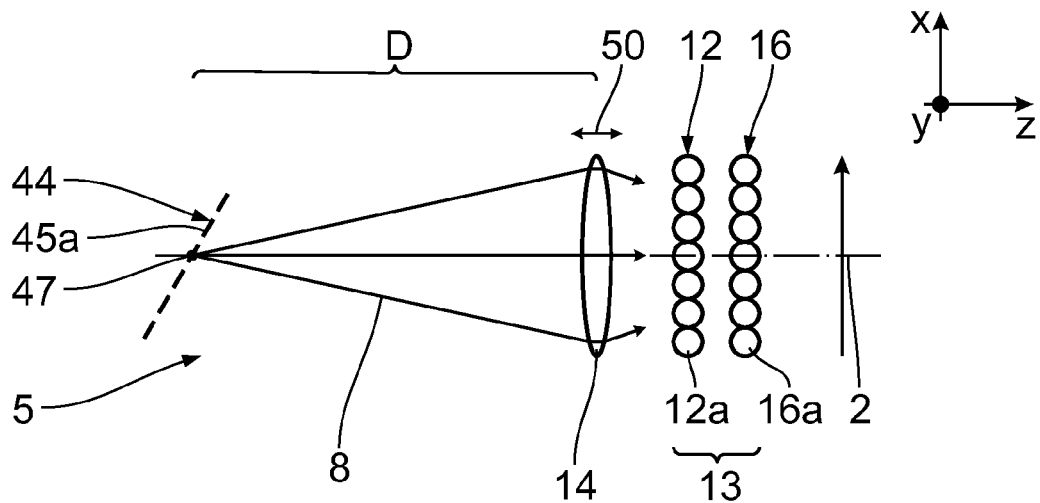
Figure 18:
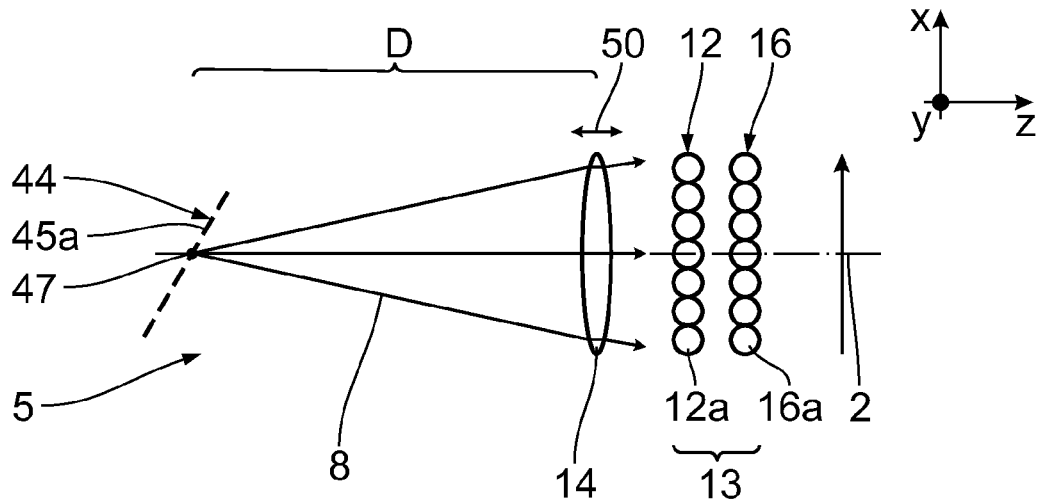

FIGS. 16 to 18 show the three basic focal length settings of the pupil lens element module 44a. The latter is illustrated schematically as a single lens element in FIGS. 16 to 18.

FIG. 16 illustrates the situation in which the effective focal length f of the pupil lens element module 44a is equal to the distance D between the principal plane 48 of the module and the center 47 of the MMA 44. Therefore, f=D holds true. Radiation 8 emerging from the center 47 of the MMA 44 is deflected by the pupil lens element module 44a such that it is incident on the raster module 13 parallel to the z-direction. Therefore, the deflection angle β is then β=0.

FIG. 17 illustrates the situation "f<D". The illumination radiation 8 is directed convergently onto the raster module 13 by the pupil lens element module 44a. This results in deflection angles +β and −β which correspond qualitatively to that which has already been explained above with reference to FIG. 12.

FIG. 18 shows the situation "f<D". The pupil lens element module 44a then directs the radiation 8 divergently onto the raster module 13. This then results in deflection angles −β/+β exactly opposite to those in the situation explained above in connection with FIG. 12.

With the settings "f<D" and "f<D" it is possible to predefine an offset of an illumination angle β, which offset is dependent on the location of an illumination pupil, that is to say for example on the position of an illumination pole.

A deflection angle contribution stemming from the location of that individual mirror 45a on the MMA 44 which brings about the respective pole impingement can occur in addition. A deflection angle and thus a field dependence of an illumination intensity from a specific illumination direction can therefore be established via a combination of the deflection angle offset dependent on the setting of the respective situation "f=D", "f<D" and "f<D" and the location selection of the individual mirror 45a used for the respective pupil illumination. This can be used in particular for compensation purposes for the illumination parameter "telecentricity".

A further embodiment of an illumination angle variation device 51 is explained below with reference to FIGS. 19 to 27. Components and functions corresponding to those which have already been explained above with reference to FIGS. 1 to 18, and in particular with reference to FIGS. 15 to 18, bear the same reference numerals and will not be discussed in detail again.

Figure 19:
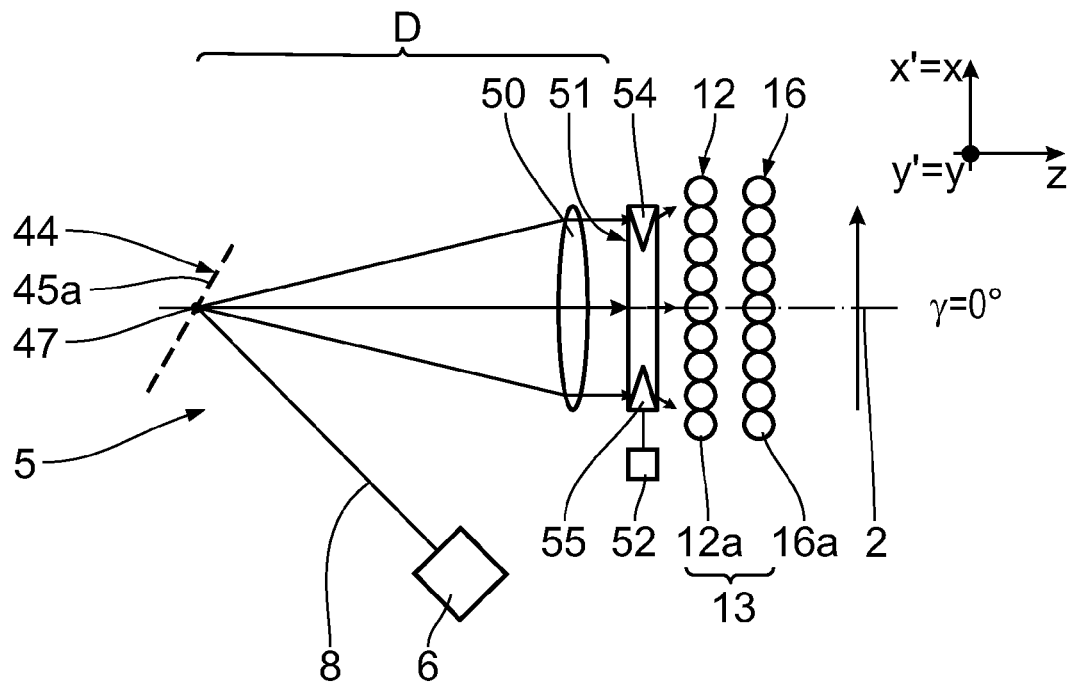
FIG. 19 shows, in an illustration similar to FIG. 15, a further embodiment of an illumination angle variation device for the illumination optical unit according to FIG. 15.

In the case of the illumination system 5 according to FIG. 19, firstly a pupil lens element 50 is arranged in the beam path between the MMA 44 and the raster module 13. For the focal length f of the pupil lens element the following holds true: f=D.

The illumination angle variation device 51 in the form of a displaceable illumination angle variation unit is arranged between the pupil lens element 50 and the raster module 13. The illumination angle variation unit 51 is operatively connected to a displacement actuator 52. The illumination angle variation unit 51 can be pivoted about the optical axis 2 via the displacement actuator 52.

Figure 20:
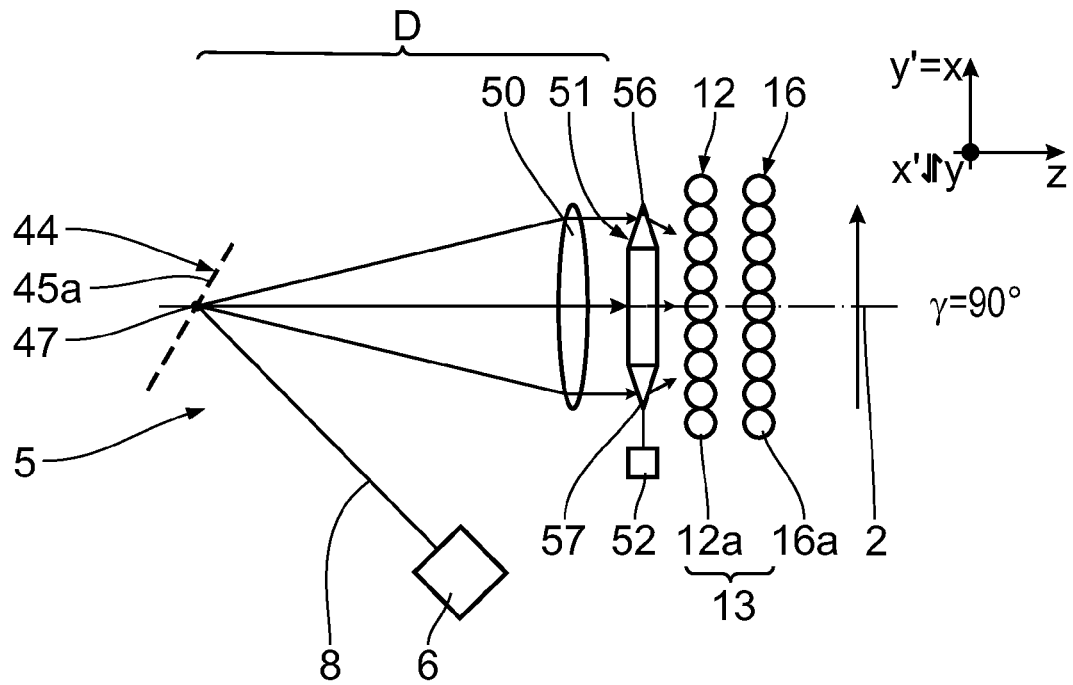
FIG. 20 shows the illumination angle variation device according to FIG. 19 in a further relative position with respect to the raster module, pivoted by 90° about an optical axis of the illumination optical unit in comparison with the relative position according to FIG. 19.
Figure 22:
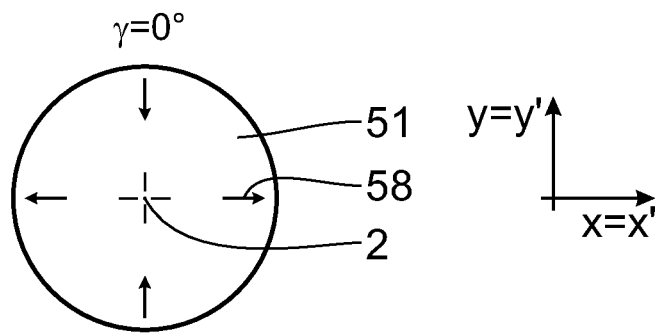
Figure 23:
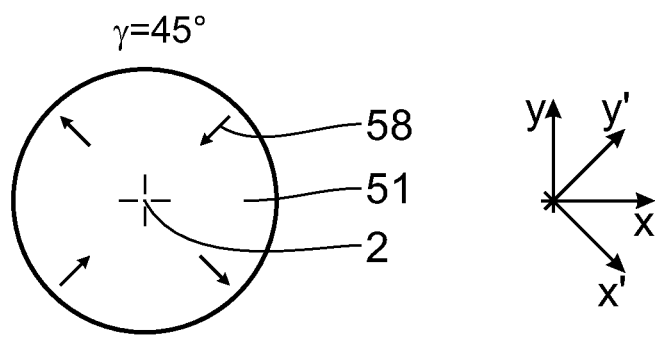
Figure 24:
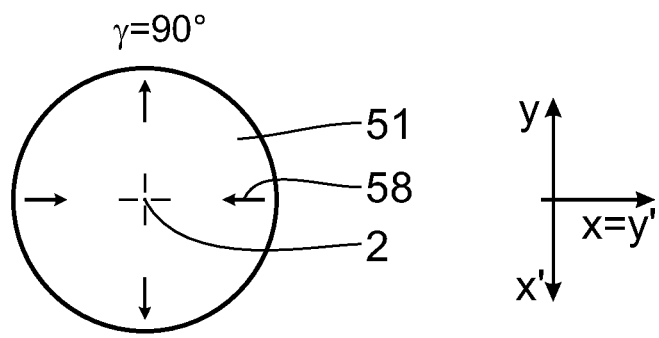

In FIGS. 19, 20 and 22 to 25, alongside the global Cartesian xyz-coordinate system, a local Cartesian x'y'-coordinate system of the illumination angle variation unit 51 is also depicted, which illustrates the pivoting position of the illumination angle variation unit 51 about the optical axis 2. FIGS. 19 and 22 show the illumination angle variation unit 51 in a pivoting position $\gamma=0°$, at which the x-axis coincides with the x'-axis and the y-axis coincides with the y'-axis. FIGS. 20 and 24 show the illumination angle variation unit 51 in the pivoting position $\gamma=90°$, at which the x-axis coincides with the y'-axis and the y-axis and the x'-axis are antiparallel to one another.

Figure 25:
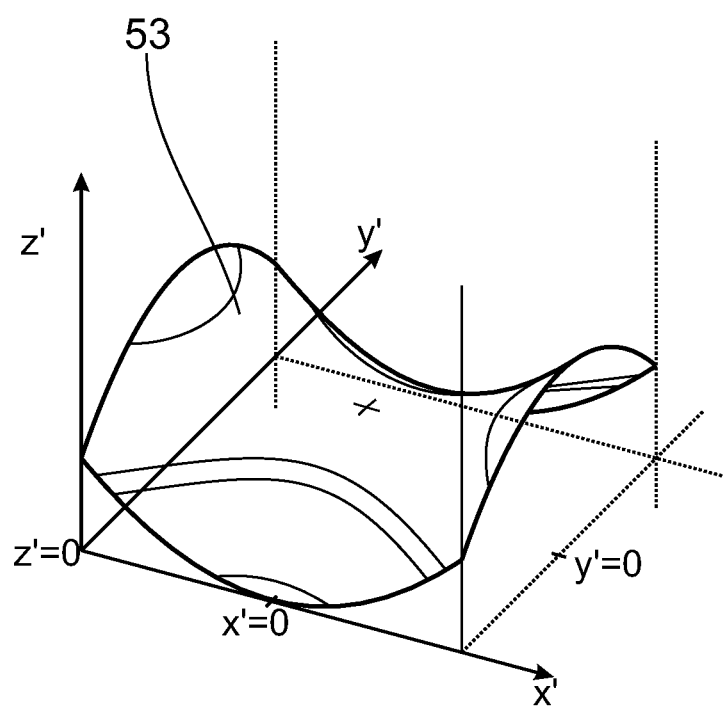
FIG. 25 perspectively shows a refractive surface of the illumination angle variation device according to FIGS. 19 and 20.

FIG. 25 shows a perspective illustration of a refractive surface, for example an entrance surface 53 of the illumination angle variation unit 51. The exit surface then results from the mirroring of the entrance surface 53 about the x'y'-plane at the location z'=0 (z=z'). The illumination angle variation unit 51 therefore constitutes a double saddle body component or saddle surface component. It is likewise possible for either the entrance surface 53 of the illumination angle variation unit 51 or the exit surface of the illumination angle variation unit to be embodied in a plane fashion. As viewed in the x'z'-plane (y'=0), the saddle surface component 51 has approximately the shape of a double wedge including wedges 54, 55, opening toward positive x'-values, on the one hand, and toward negative x'-values, on the other hand, as illustrated schematically in FIG. 19. In the y'z'-plane (if x'=0) the saddle surface component 51 has in turn the shape of two wedges 56, 57 closing in each case toward the edge, as indicated in FIG. 20.

A refractive effect and thus a deflection-angle-generating effect of the illumination angle variation unit 51 is illustrated by direction arrows 58 in FIGS. 22 to 24.

In the position according to FIG. 22, a deflection acting radially outward in relation to the optical axis 2 is generated on the one hand in the positive x-direction and on the other and in the negative x-direction by the portions of the saddle surface component 51 including the wedges 54, 55, that is to say in the xz-plane a deflecting effect corresponding to that according to FIG. 18. In the yz-plane, by contrast, in the relative position according to FIGS. 19 and 22, a deflecting effect radially inward, that is to say in each case toward the optical axis 2, that is to say a deflecting effect corresponding to FIG. 17, is obtained. By rotation of the illumination angle variation unit 51 about the optical axis 2 by the rotation angle γ it is possible to vary the deflecting effect in particular in the x-direction, that is to say in the xz-deflection plane.

FIG. 23 shows here in the limiting case $\gamma=45°$ a deflection effect that is neutral in the x-direction, since in the transition region between the portions of the wedges 54 and 56, on the one hand, and 55 and 57, on the other hand, the deflecting effects radially outward and radially inward precisely cancel one another out.

FIG. 24 shows the pivoting position $\gamma=90°$. Here the wedges 56, 57 are now arranged in the xz-plane, thus resulting in a deflecting effect radially inward, that is to say toward the optical axis 2, in the x-direction, corresponding to the effect described above in connection with FIG. 17.

Figure 21:
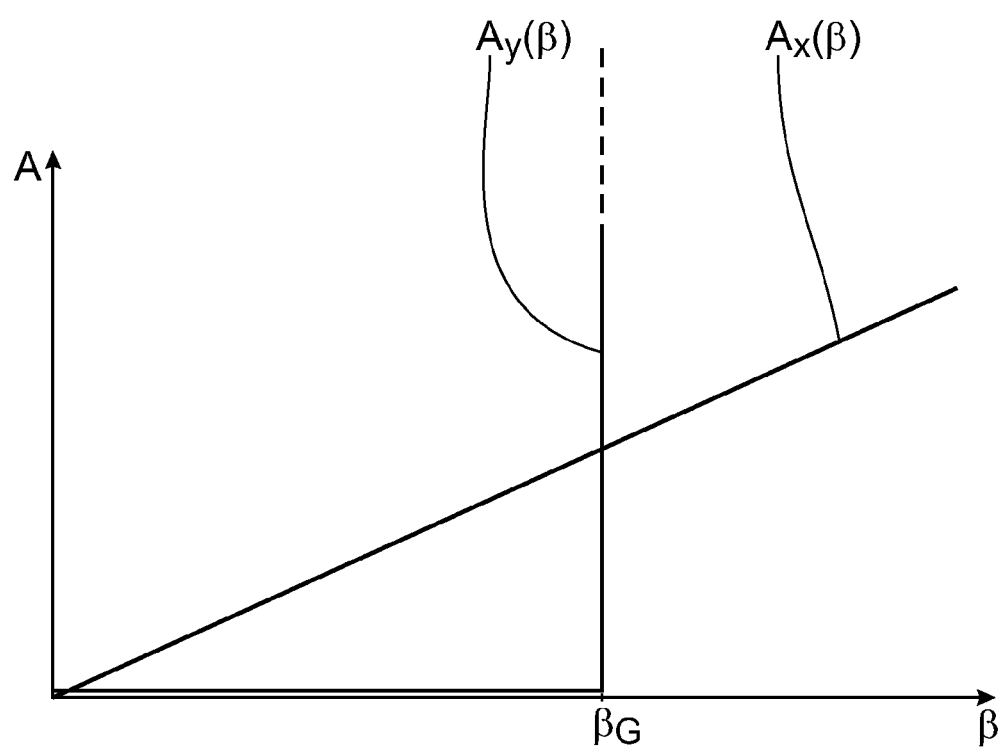
FIG. 21 schematically shows in a diagram the dependence of an amplitude A of a field profile of an intensity over the object field on a deflection angle β, generated by the illumination angle variation device according to FIGS. 19 and 20, wherein the field profile of the amplitude is specified in the two extension dimensions x and y of the object field.

FIG. 21 shows the effects of an angle β of incidence on the raster element 13 on the amplitude A of the field profile of the intensity over the illumination or object field 3, on the one hand if the angle β runs in the x-direction, the beam thus running in the x-z-plane, designated as curve profile $A_x(\beta)$, and on the other hand for the y-direction with the curve profile $A_y(\beta)$. As the angle β of incidence increases, the amplitude $A_x(\beta)$ of the field profile of the intensity I (also cf. the explanations concerning FIG. 13) increases approximately linearly in the x-direction. In the y-direction, a corresponding amplitude $A_y(\beta)$ of the field profile of the intensity remains uninfluenced up to a limiting angle $\beta_G$ of incidence. In the case of the design of the illumination angle variation unit 51, the wedge angles of the portions of the saddle surface component including the wedges 54, 55, on the one hand, and the wedges 56, 57, on the other hand, are designed such that this maximum angle $\beta_G$ of incidence is not exceeded at least in the y-direction. Between the maximum angles $+/-\beta_G$ of incidence, the angle β of incidence in the xz-deflection plane can then be varied in a continuously variable manner by a rotation of the illumination angle variation unit 51 between the angles $\gamma=0$ and $\gamma=90°$. In the y-direction, the amplitude of the field profile A then remains uninfluenced, as desired.

Figure 26:
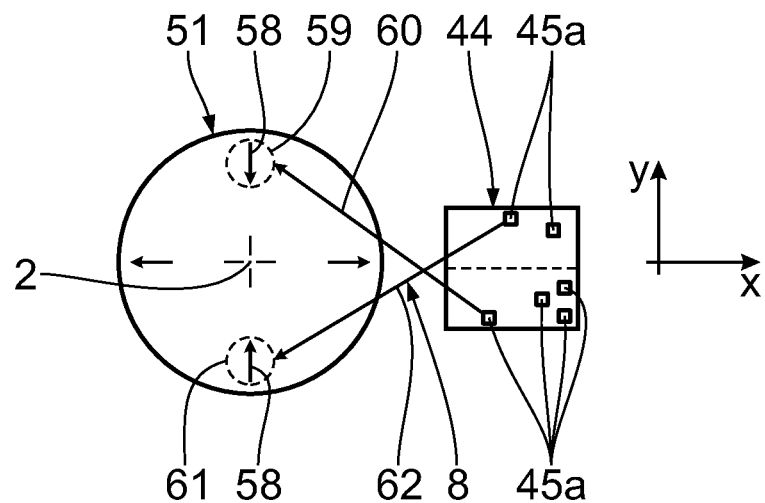
FIGS. 26 and 27 show two examples of impingement on the illumination angle variation device according to FIG. 19 with a micro-mirror array (multi-mirror array, MMA) of the illumination optical unit according to FIG. 15, wherein the components impinged on successively are shown in each case in a plan view and alongside one another for the sake of simplified illustration.
Figure 27:
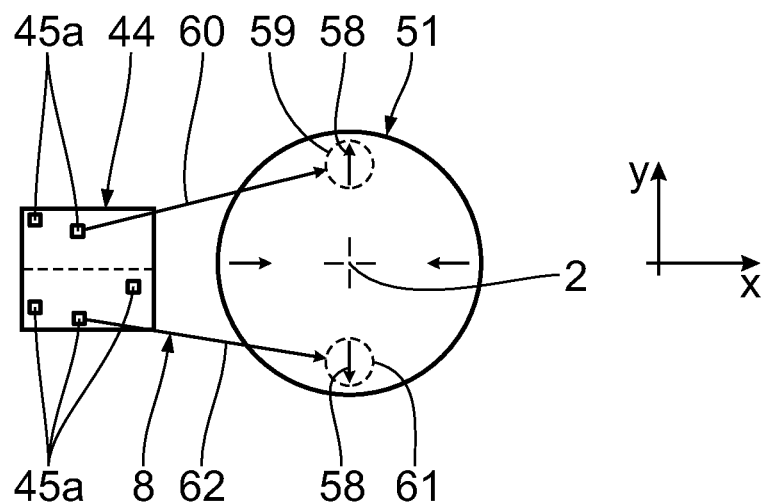

FIGS. 26 and 27 show different impingement variants of the illumination angle variation unit 51 via the individual mirrors 45a of the MMA 44. Some of the individual mirrors 45a of the MMA 44 are indicated by way of example in FIGS. 26 and 27.

FIGS. 26 and 27 illustrate both the MMA 44 and the illumination angle variation unit 51 in a plan view, that is to say in each case in the projection onto the xy-plane. In actual fact the components 44 and 51 are not arranged alongside one another, but rather one behind the other. The pupil lens element 50 (cf. FIGS. 19 and 20), is situated between the components 44 and 51. The pupil lens element 50 can also be arranged between the illumination angle variation unit 51 and the raster element 13. The optical effect of the pupil lens element 50 can also be integrated into the illumination angle variation unit 51.

For the following description it is assumed that the pupil lens element is situated between the components 44 and 51. The arrows in FIGS. 26 and 27 show an assignment from 45a of the MMA 44 to locations of the illumination angle variation unit 51 and thus approximately to a pupil plane of the illumination system 5. On account of the effect of the pupil lens element 50, the corresponding beams generally do not run along a straight line. The angle of incidence on the raster element 13 is dependent on the relative arrangement of the relevant individual mirror 45a of the MMA and the location of incidence on the illumination angle variation unit 51 and is also dependent on the deflection angle caused by the illumination angle variation unit.

FIG. 26 shows an impingement variant "Y-dipole", in which a +Y-pole region 59 of the illumination angle variation unit 51 is impinged on from an individual mirror 45a from a lower half of the MMA 44 in FIG. 26. A beam path of an individual ray by way of example for this is indicated by an arrow 60 in FIG. 26. Conversely, a −Y-pole region 61 on the illumination angle variation unit 51 is illuminated via an individual mirror 45a from the upper half of the MMA 44 in FIG. 26, as indicated by an arrow 62 for a beam path in FIG. 26.

In the case of the illumination according to FIG. 26, the illumination angle variation unit 51 is present in the relative position "γ=0°" according to FIG. 22. In the Y-pole regions 59, 61 of the illumination angle variation unit 51, the illumination radiation 8 is therefore deflected radially toward the optical axis 2, as indicated by the direction arrows 58 in the Y-pole regions 59, 61. The beam angles of the beam paths 60, 62 of the illumination radiation 8 with respect to the optical axis 2, which angles are directed outward and are large on account of the crosswise assignment of the beam paths 60, 62 to the Y-pole regions 59, 61, are bent over inward as a result of the effect of the regions of the saddle surface component 51 including the wedges 56, 57. It is thus possible to prevent the limiting angle $\beta_G$ from being exceeded.

FIG. 27 shows a variant of the illumination of the Y-pole regions 59, 61 in the position of the illumination angle variation unit 51 "γ=90°" according to FIG. 24. The beam angles in the y-direction upon incidence on the illumination angle variation unit 51 are small. The beams are bent over inward by the pupil lens element 50 situated in the beam path downstream of the illumination angle variation unit 51, such that a large absolute value of the angle of incidence on the raster element 13 can result. On the illumination angle variation unit 51, in the Y-pole regions 59, 61, the regions of the saddle surface component 51 including the wedges 54, 55 now act, which lead to an additional deflection of the radiation 8 radially outward and thus partly compensate for the effect of the pupil lens element 50. In the case of the illumination of the Y-pole regions 59, 61 according to FIG. 27, the assignment of the individual mirrors 45a which provide for the impingement on the Y-pole regions 59, 61 is exactly interchanged in comparison with FIG. 26. The absolute deflection angles of the individual rays of the illumination light beam 8 from MMA 44 to the illumination angle variation unit 51 are thus reduced, such that the increase in the deflection angles as a result of the wedges 54, 55 in the Y-pole regions 59, 61 in the position according to FIG. 27 leads to a total angle of incidence that is tenable with regard to its absolute value. It is thus possible to prevent the limiting angle $\beta_G$ from being exceeded.

In particular, an undesirably large deflection in the yz-plane, that is to say perpendicular to the xz-deflection plane, is thus avoided.

Further embodiments of an illumination angle variation device 63 are explained below with reference to FIGS. 28 to 31. Components and functions corresponding to those which have already been explained above with reference to FIGS. 1 to 27 bear the same reference numerals and will not be discussed in detail again.

Figure 28:
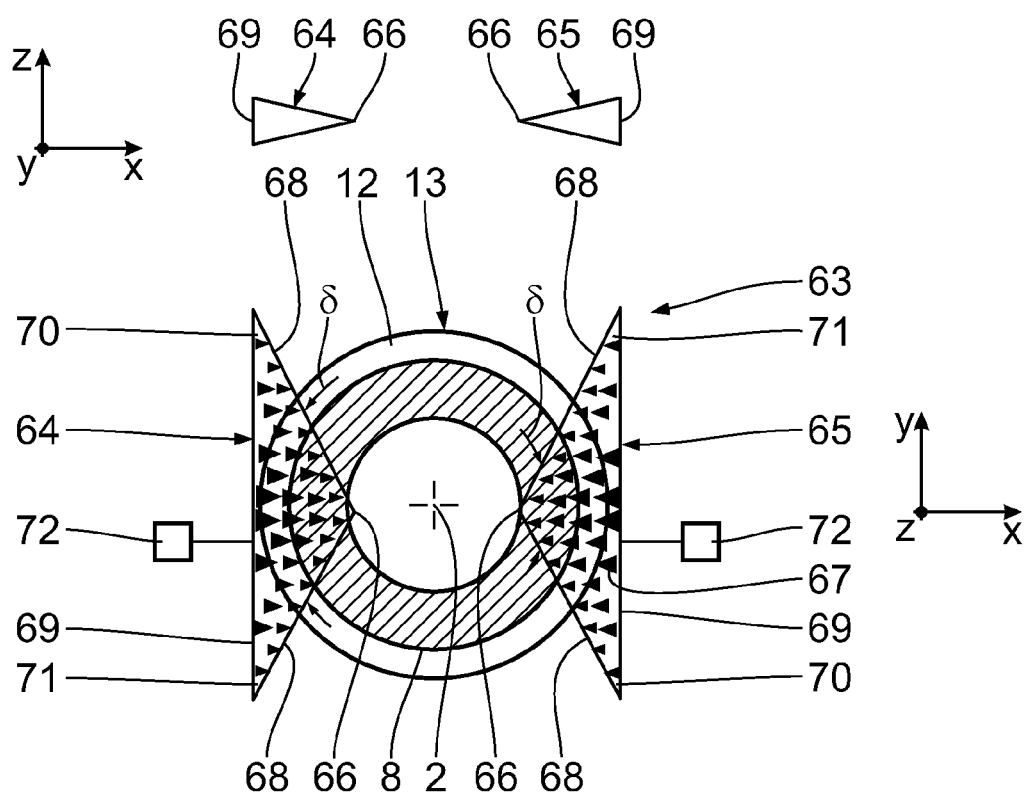
FIG. 28 shows a further variant of an illumination angle variation device, illustrated in a plan view in the beam direction of the illumination light, an entrance-side surface of the raster module also being shown.

The illumination angle variation device 63 is illustrated in a plane view in FIG. 28, the viewing direction, as e.g. also in FIGS. 22 to 24, 26 and 27, running along the optical axis 2. FIG. 28 illustrates the illumination angle variation device 63 upstream of the first raster arrangement 12 of the raster module 13 on the basis of the example of an annular illumination of the first raster arrangement 12.

The illumination angle variation device 63 includes two illumination angle variation units 64, 65, each wedge-shaped in the plan view according to FIG. 28. Wedge vertices 66 of the illumination angle variation units 64, 65 lie in the xz-plane, in which the optical axis also lies. An apex angle δ of the wedge-shaped illumination angle variation units 64, 65 is approximately 130°. A different apex angle in the range of between 90° and 160° is also possible.

A deflection effect of the illumination angle variation units 64, 65 in the xz-deflection plane is illustrated by arrowheads 67 of different sizes in FIG. 28. In this case, the direction of the arrowhead indicates the direction in which the deflection effect takes place, and the size of the arrow represents a measure of the absolute value of this deflecting effect. Adjacent to the two wedge edges 68 respectively adjoining the wedge vertex 66, this deflection effect 67 has in each case the same and relatively small absolute value. With increasing distance from the wedge edges 68, the deflection effect in the xz-deflection plane increases continuously. This has the effect that in the region of a wedge base 69 of the wedge-shaped illumination angle variation units 64, 65, the deflecting effect is greatest in a base center and decreases continuously toward the two pointed lateral corners 70, 71 of the wedges. A gradient of a refractive surface in the xz-plane is correspondingly the highest in the region of the base centers. In the xz-cross section illustrated above the plan view in FIG. 28, the illumination angle variation units 64, 65 are therefore likewise wedge-shaped and in each case taper toward the optical axis 2.

As viewed in the xy-plane, the wedge edges 68 have a gradient $|dy/dx|$ which is significantly greater than 1 and is approximately 2 as well in the example illustrated. A spatially non-constant deflection effect in the horizontal direction leads to an undesired deflection effect. This undesired deflection effect in a vertical direction can be kept within acceptable limits if the gradient $|dy/dx|$ is sufficiently high.

The illumination angle variation units 64, 65 according to FIG. 28 are in each case connected to a displacement actuator 72, by which the illumination angle variation units 64, 65 are displaceable along the x-direction, that is to say can be moved into and out of the beam path of the illumination radiation 8 along the x-direction. In the effective position illustrated in FIG. 28, a region of the wedge-shaped illumination angle variation units 64, 65 around the wedge vertices 66 is effective for influencing the annular illumination of the first raster arrangement 12. On account of the high gradient of the wedge edges 68, a smooth transition between radiation that is deflected by the illumination angle variation units 64, 65 in the xz-deflection plane and undeflected radiation 8 arises in a large region of this annular illumination.

Figure 29:
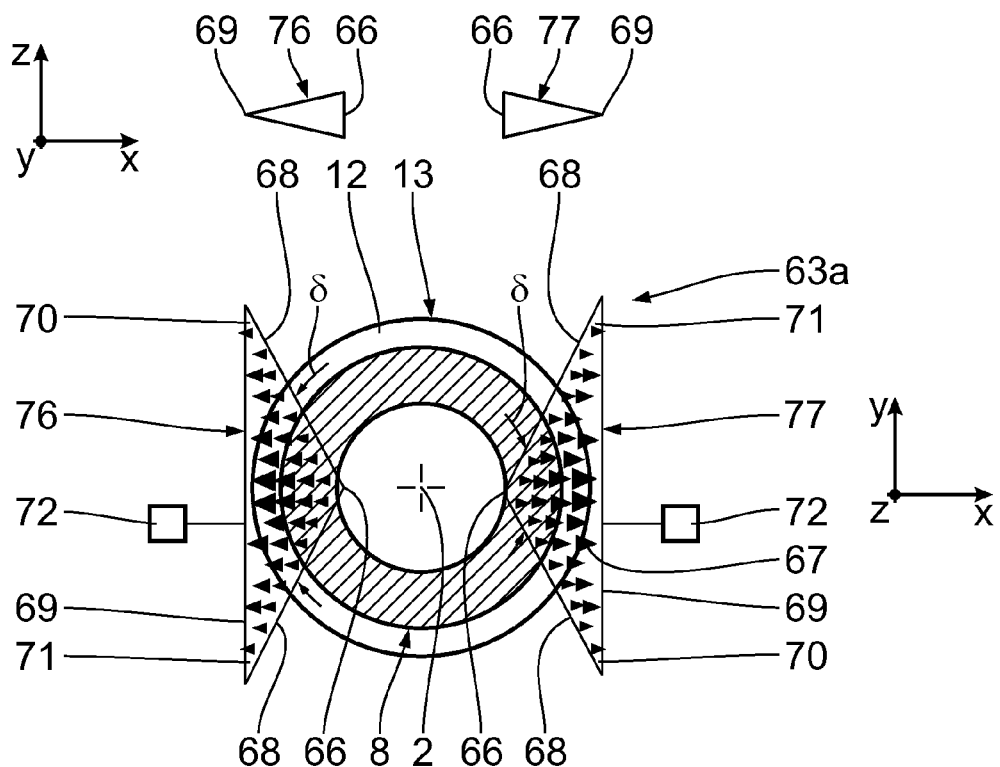
FIG. 29 shows, in an illustration similar to FIG. 28, two illumination angle variation units having an inverse deflection effect in comparison with those according to FIG. 28.

FIG. 29 shows, in an illustration similar to FIG. 28, a further illumination angle variation device 63a including two illumination angle variation units 76, 77. Components which have already been explained above in connection with FIG. 28 bear the same reference numerals and will not be discussed in detail again. In the relative position with respect to the raster module 13 as illustrated in FIG. 29, in a plan view, that is to say in an xy-projection, the illumination angle variation units 76, 77 have the same outer contour as the illumination angle variation units 64, 65 according to FIG. 28. A deflecting effect of the illumination angle variation units 76, 77 in the xz-deflection plane is exactly the inverse of the deflecting effect of the illumination angle variation units 64, 65. This is made clear in FIGS. 28 and 29 by wedge illustrations in each case in the upper region of FIGS. 28 and 29, indicating an xz-section through the respective illumination angle variation units at the level of the optical axis 2. While in the case of the illumination angle variation units 64, 65 in the xz-section the wedge vertices 66 simultaneously constitute the thinnest portions in the z-beam direction, this is exactly the opposite in the case of the illumination angle variation units 76, 77, where the wedge base regions 69 are in each case the thinnest.

Correspondingly, the arrowheads 67 indicating the deflecting effect of the illumination angle variation units 76, 77 in the xz-deflection plane now run from the wedge vertices 66 of the illumination angle variation units 76, 77 toward the respective wedge base 69.

Figure 30:
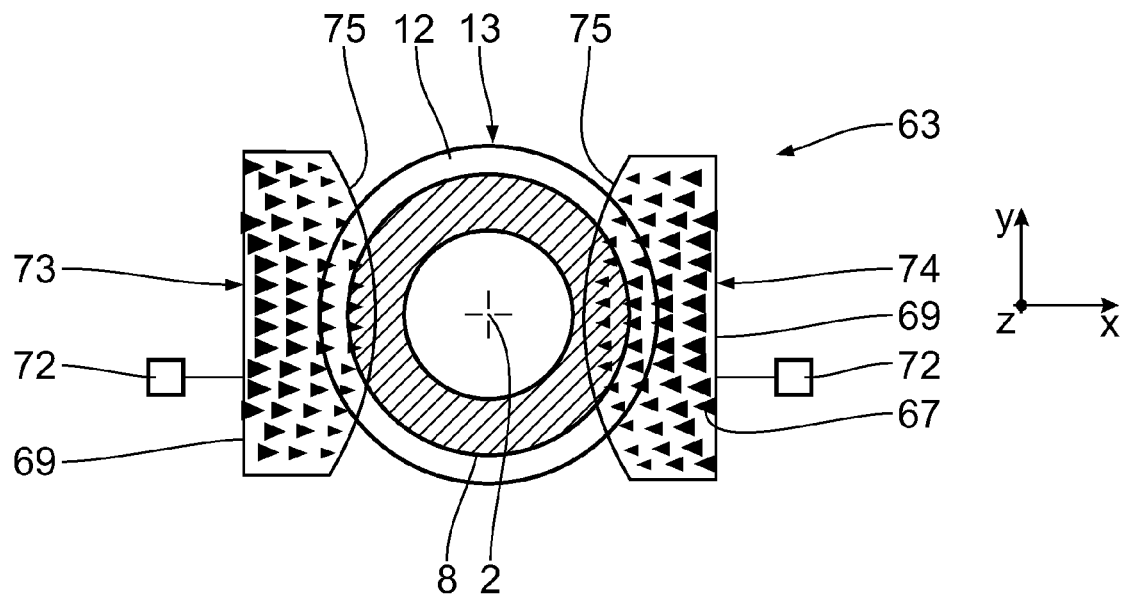
FIG. 30 shows, in an illustration similar to FIG. 28, a further variant of an illumination angle variation device.

FIG. 30 shows a modified embodiment of the illumination angle variation device 63. Components and functions which have already been explained above in connection with FIG. 28 bear the same reference numerals and will not be explained again in detail. Illumination angle variation units 73, 74 are provided with an approximately crescent-shaped edge region 75, which constitutes a rounded variant of the wedge edges 68 adjoining one another via the wedge vertex 66 in the embodiment according to FIG. 28. The illumination angle variation units 73, 74 dip into the beam path of the illumination radiation 8 via the crescent-shaped edge regions 75.

In the xz-cross section not illustrated in FIG. 30, the illumination angle variation units 73, 74, as already explained above in connection with the illumination angle variation units 64, 65, are likewise wedge-shaped and likewise taper toward the optical axis 2.

The gradient |dy/dx| along the edge regions 75 is once again significantly greater than 1 and, in the exemplary embodiment illustrated, where the edge regions 75 dip into the radiation 8, is even greater than 2.

Figure 31:
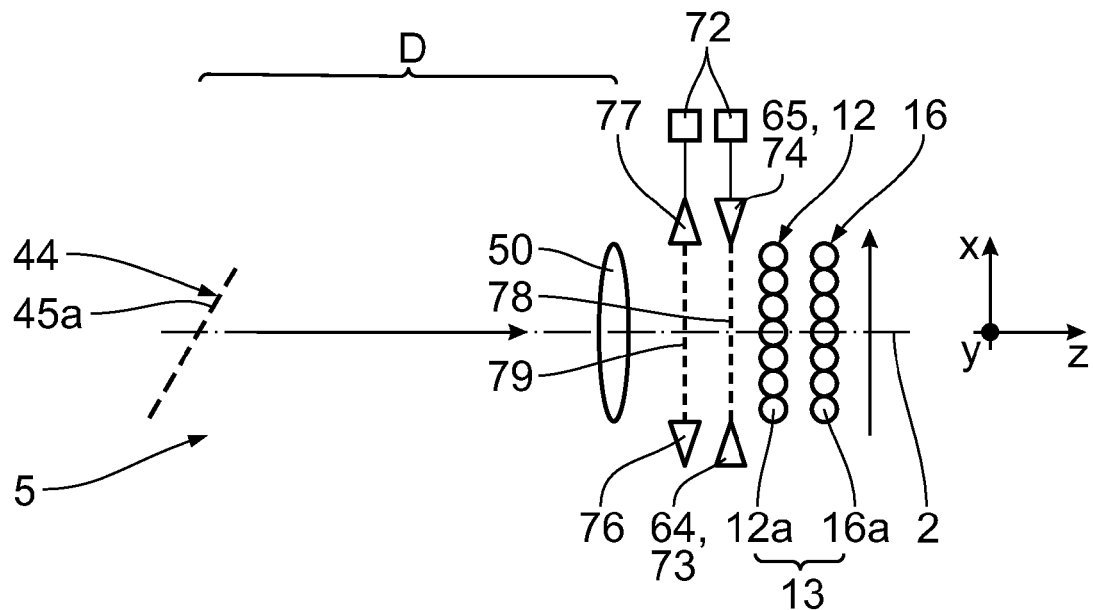
FIGS. 31 and 32 show, in an illustration similar to FIG. 19, different relative positions of illumination angle variation units according to the type of the illumination angle variation device according to FIGS. 28 and 29 upstream of the raster module of the illumination optical unit according to FIG. 15.
Figure 32:
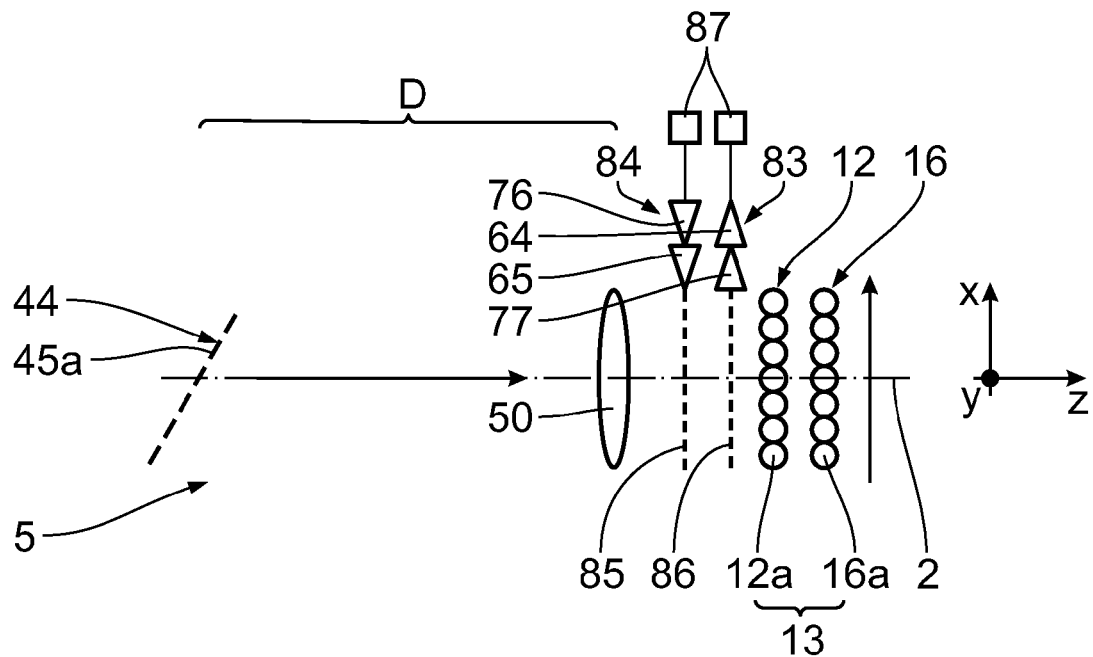

FIGS. 31 and 32 show different arrangement variants of wedge-shaped illumination angle variation units 64, 65 and 73, 74 between the pupil lens element 50 and the raster module 13. Alongside illumination angle variation units having wedge shapes tapering in the direction toward the optical axis 2, as described above in connection with FIGS. 28, 30, further illumination angle variation units 76, 77 can be arranged between the pupil lens element 50 and the raster module 13, the wedge shapes of which taper in a pointed fashion outward in the x-z-section. These different illumination angle variation units 64, 65 or 73, 74, on the one hand, and 76, 77, on the other hand, can be arranged in different arrangement planes 78, 79 spaced apart from one another between the pupil lens element 50 and the raster module 13.

The last-described variants of the illumination angle variation device 44a, 51 and 63 can also cooperate with a measuring device 32 and a control/regulating unit 33, as explained above in connection with the embodiments according to FIGS. 1 to 14. The control/regulating unit 33 is then signal-connected to the displacement drives 49, 52 and 72, respectively.

Figure 33:
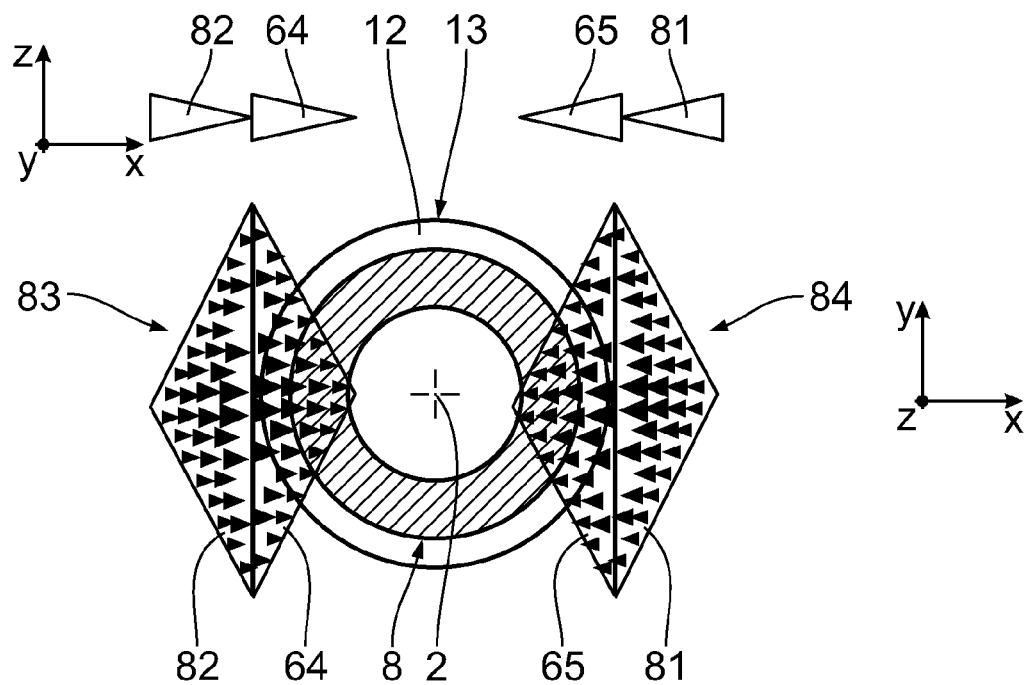
FIGS. 33 and 34 show two arrangement variants of an illumination angle variation device according to FIG. 32.
Figure 34:
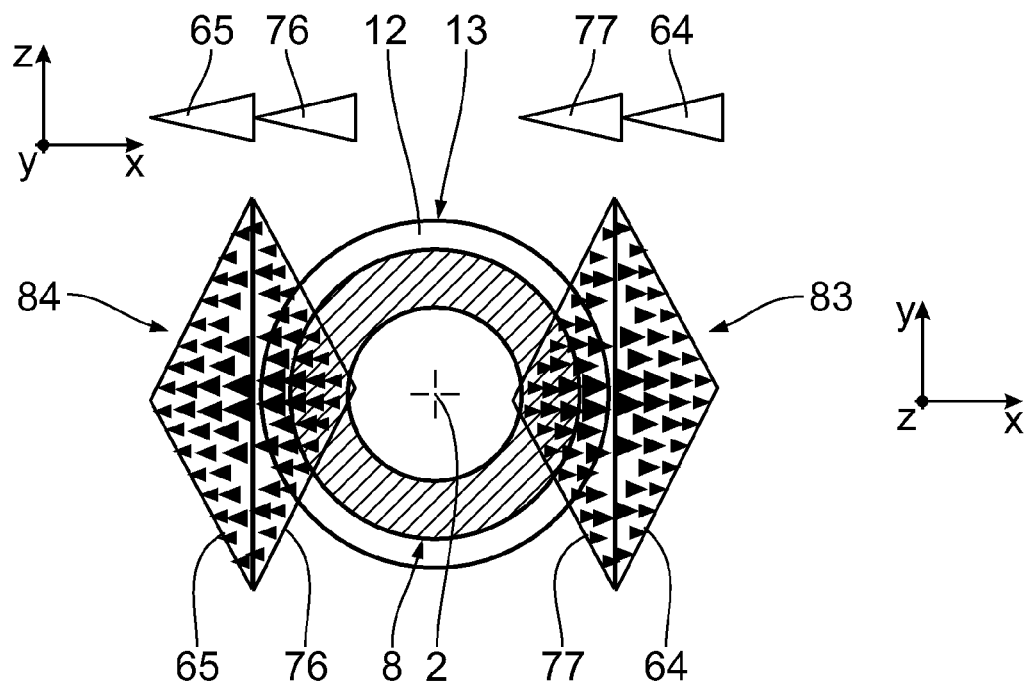

The illumination angle variation devices 63 and 63a can be combined, as shown in FIGS. 32 to 34. For this purpose, two pairs 83, 84 of illumination angle variation units 77, 64 on the one hand, and 65, 76, on the other hand, are connected to one another as integrated illumination angle variation modules.

The illustration in FIGS. 33 and 34 is analogous to that according to FIGS. 28 and 29.

The pairs 83, 84 can be displaced independently of one another in displacement planes 85, 86 spaced apart from one another, the planes running parallel to the xy-plane, between the pupil lens element 50 and the raster module 13 via displacement drives 87.

FIG. 33 shows the relative position of the pairs 83, 84 at which illumination angle variation units 64, 65 are effective. This relative position corresponds to the effective position according to FIG. 28.

FIG. 34 shows the relative position at which the respective other illumination angle variation units 76, 77 of the pairs 83, 84 become effective for the illumination radiation 8, that is to say deflect the illumination radiation 8 in portions in the xz-deflection plane.

In relation to the xy-projection illustrated in FIG. 34, the pairs 83, 84 have therefore exchanged their places in comparison with the relative position according to FIG. 33.

The four illumination angle variation units 64, 65, 76, 77 can therefore be operated with exactly two displacement actuators 87 via the pairwise arrangement according to FIGS. 32 to 34.

Figure 35:
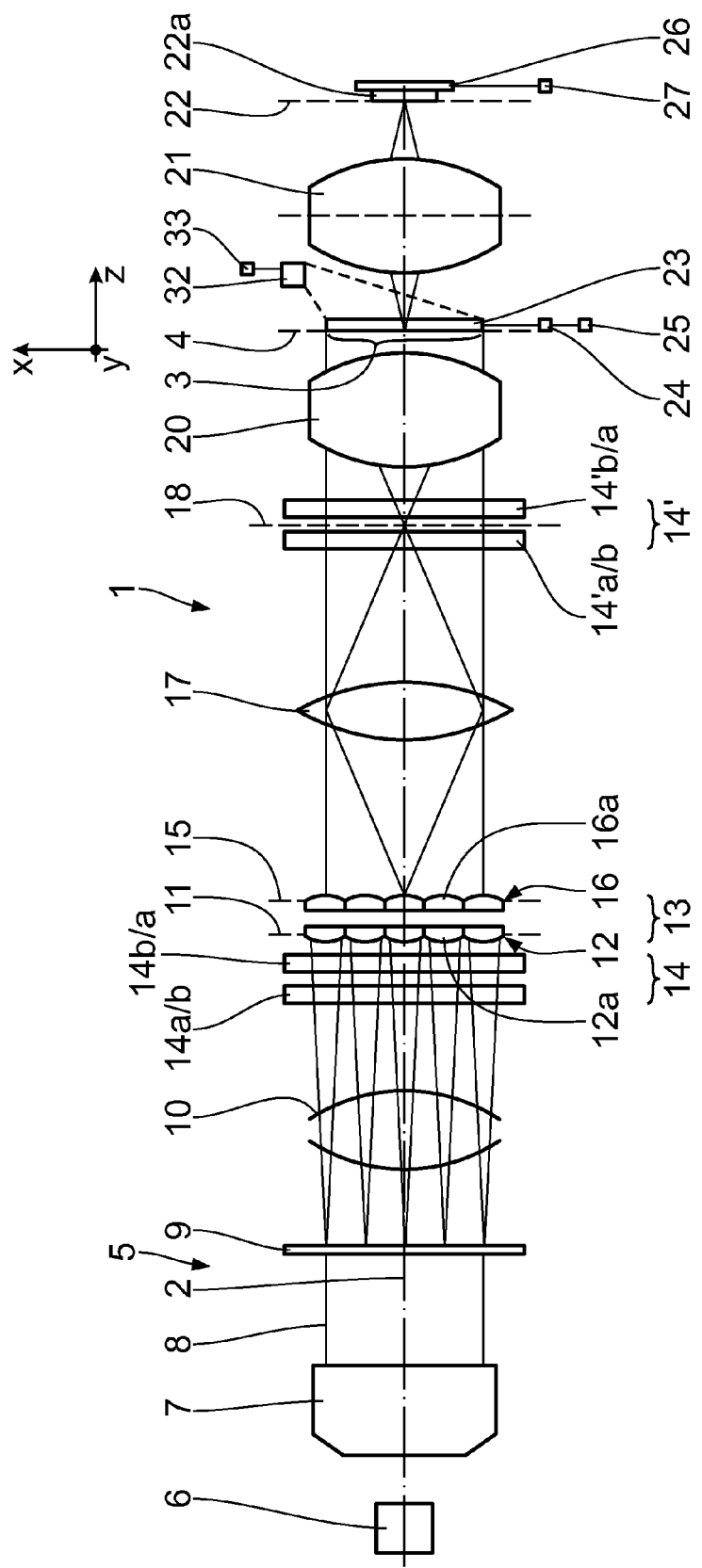
FIG. 35 shows an illustration of the illumination system similar to FIG. 1 with an additional arrangement variant of an illumination angle variation unit in a field intermediate plane upstream of an illumination field.

FIG. 35 shows a further arrangement variant for an illumination angle variation device. Alongside the arrangement of the illumination angle variation device 14 upstream of the raster module 13, as already explained above in connection with FIG. 1, for example, FIG. 35 also shows an arrangement of an illumination angle variation device on the basis of the example of an illumination angle variation device 14' in the field intermediate plane 18. The illumination angle variation device 14' including once again two illumination angle variation units 14'a, 14'b can be used as an alternative to or in combination with the illumination angle variation device 14 explained above.

In principle, one of the illumination angle variation devices also described below in connection with FIGS. 36 to 55 can be used for both illumination angle variation devices 14, 14'.

The arrangement of the illumination angle variation device upstream of the raster module 13 can bring about telecentricity value changes via intensity variations which are brought about by the interplay of the illumination angle variation device, on the one hand, and the downstream raster module 13, on the other hand, as explained above in particular in connection with FIG. 12 to 14. An arrangement of the illumination angle variation device in a field plane of the illumination optical unit, that is to say in the field intermediate plane 18, for example, brings about, via the effect of the illumination angle variation device, a direction change—dependent on the location on the illumination field 3—for an entire light beam of the illumination light 8 impinging on this field point. This is also referred to as a geometrical telecentricity change. In the case of the illumination system 5, illumination angle variation devices can be provided both upstream of the raster module 13 and in the field intermediate plane 18. Alternatively, an arrangement is also possible in which an illumination angle variation device is arranged exclusively upstream of the raster module 13 or exclusively in a field plane of the illumination optical unit, for example in the field intermediate plane 18.

A further embodiment of an illumination angle variation device 88 is described below with reference to FIGS. 36 to 38. Components and functions corresponding to those which have already been explained above with reference to FIGS. 1 to 35 bear the same reference numerals and will not be discussed again in detail.

The illumination angle variation device 88 has two refractive optical plates 89, 90. Both plates have the same spatial shape and each have a plane optical surface and a curved optical surface. A height profile H(x, y) of the plates 89, 90 has the following functional form:

$$H(x,y)=A+Bx^2y$$

In this case, the y-coordinate runs parallel to the object displacement direction. The x-coordinate runs perpendicular to the y-coordinate and parallel to the field height of the illumination field 3. Both the x-coordinate and the y-coordinate run perpendicular to the optical axis 2, that is to say perpendicular to the beam path of the illumination light 8.

A and B in the above formula are freely selectable parameters which can be used to set a desired course of the functional dependence of the height profile on the coordinates x and y. Overall, a parabolic xz-profile of the curved surfaces of the two plates 89, 90 thus arises in each case, the parabolic shape changing depending on the y-position of this xz-section.

Figure 36:
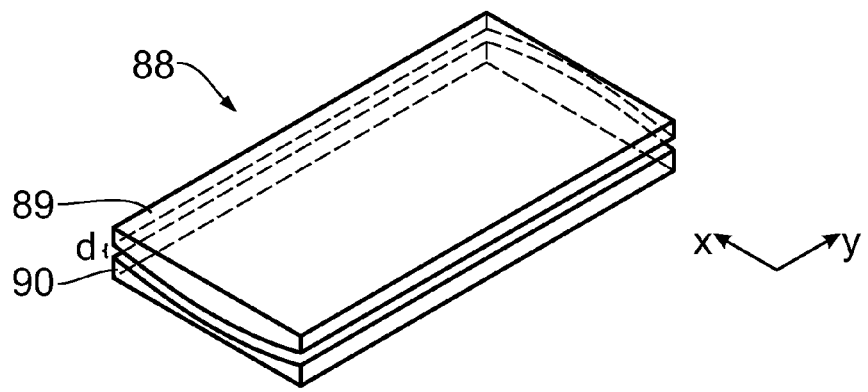
FIG. 36 shows a further embodiment of an illumination angle variation device including reflective optical plates arranged in a displaceable fashion relative to one another perpendicular to the beam path of the illumination light.

FIG. 36 shows the illumination angle variation device 88 in a zero position, in which the two plates having curved surfaces facing one another are oriented with respect to one another such that an air gap d has the same air gap width or the same air clearance in each case independently of the plate location. In the zero position, the two plates 89, 90 therefore have the same air clearance with respect to one another, independently of the location x, y considered. In the neutral position according to FIG. 36, the illumination angle variation device has no angle-influencing effect on the illumination light 8.

Figure 37:
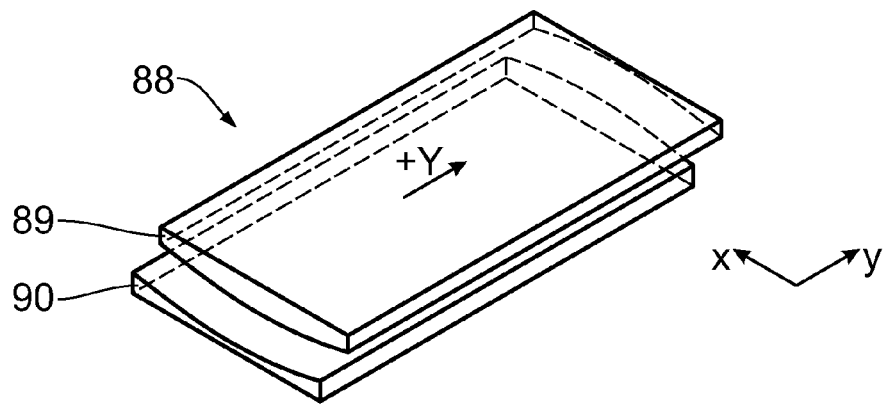
FIG. 37 shows the embodiment according to FIG. 36 in a displacement position of the two plates with respect to one another in which one of the two plates is displaced relative to the other parallel to an object displacement direction.

FIG. 37 shows the illumination angle variation device 88 in an effective position in which the upper plate 89 in FIG. 37 is displaced relative to the lower plate 90 by a displacement value "+Y" in the x-direction, that is to say parallel to the object displacement direction of the object in the illumination field 3. On account of the y-dependence of the parabolic height profile of the curved surfaces of the plates 89, 90 facing one another, this then results in an air gap variation against the x-coordinate between the plates 89, 90 which for its part depends parabolically on x. On account of the linear dependence of the height profiles on the y-coordinate, this parabolic x-variation of the air gap is substantially independent of the y-coordinate.

Figure 38:
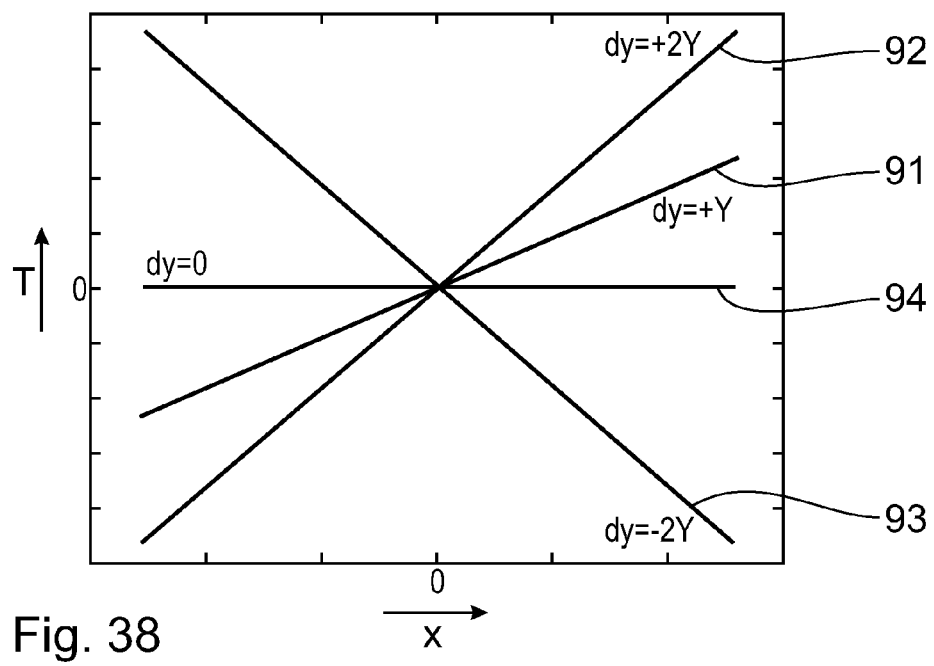
FIG. 38 shows, in an illustration similar to FIG. 14, different variations of a telecentricity value against the field height of the illumination field, in each case depending on a relative displacement of the two plates of the embodiment according to FIGS. 36 and 37 with respect to one another parallel to the object displacement direction.

On account of the parabolic x-variation of the air gap between the plates 89, 90 in the effective position according to FIG. 37, a linear telecentricity value profile 91 illustrated in FIG. 38 results. The telecentricity value profile 91 has a positive gradient that correlates with the displacement travel "+Y".

Further telecentricity value profiles 92, 93 and 94 for the relative displacements "+2Y", "−2Y" and "0" between the plates 89 and 90 are additionally plotted in FIG. 38. The relative displacement "0" corresponds to the neutral position according to FIG. 36.

Analogously to what has already been explained above in connection particularly with FIG. 14, a linear telecentricity value profile can be influenced in a continuously variable manner via the illumination angle variation device 88 as well. In this embodiment, such a telecentricity profile can generally be represented as $$T(x;Y)=d/dx(H(x,y)+H(x,y-Y)).$$

H(x, y) here is the height profile of the plates 89 and 90.

A further embodiment of an illumination angle variation device 95 similar to FIGS. 37 and 38 is explained below with reference to FIGS. 39 and 40. Components and functions corresponding to those which have already been explained above with reference to FIGS. 1 to 38, and in particular with reference to FIGS. 36 and 37, bear the same reference numerals and will not be discussed in detail again.

Figure 39:
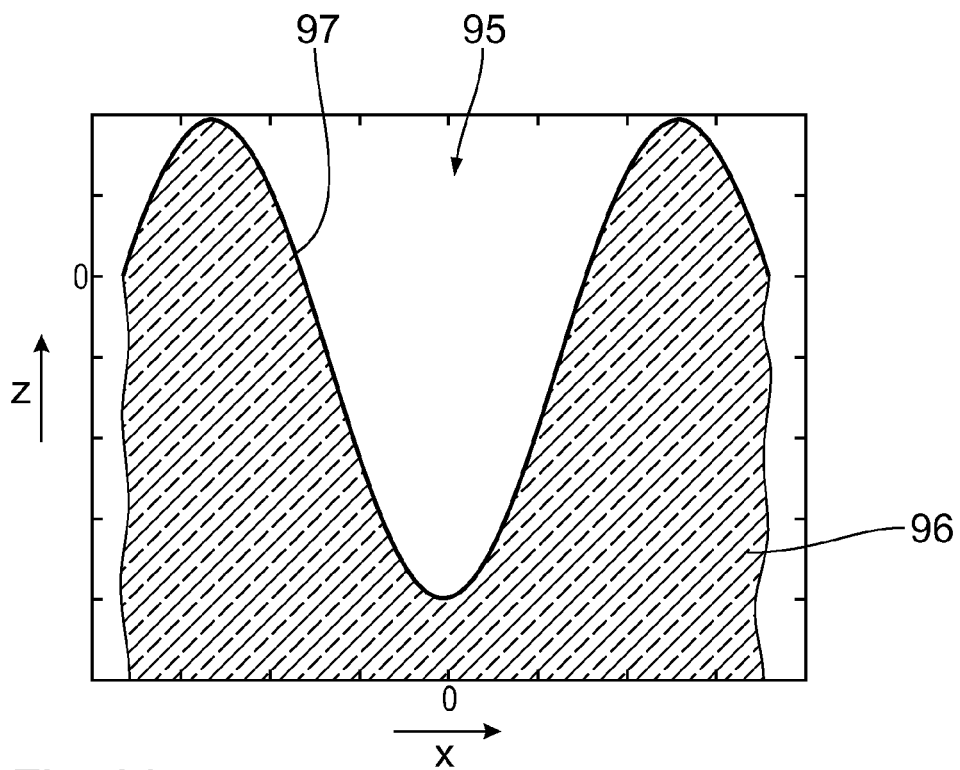
FIG. 39 shows a height profile of one of two plates of a further embodiment of an illumination angle variation device which is similar to that according to FIGS. 36 and 37, with a height profile having a course against the field height in accordance with a cosine function.

One of two refractive optical plates 96 of the illumination angle variation device 95 is illustrated in the xz-section in FIG. 39. The optical plates 96 once again have a plane surface and an opposite curved surface 97. In the case of the embodiment according to FIGS. 39 and 40, a curvature of the curved surface 97 follows a cosine function depending on the x-coordinate parallel to the field height.

Figure 40:
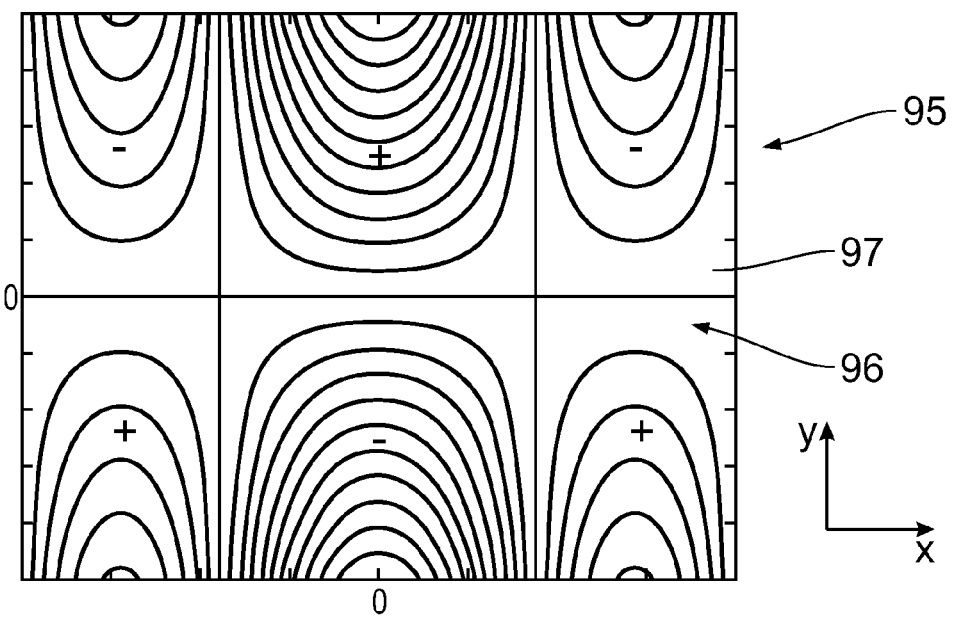
FIG. 40 shows a height profile of the plates according to FIG. 39, as seen in a plan view of the profiled, that is to say curved, plate surface.

FIG. 40 shows a height profile of one of the two plates 96 in a plan view of the curved surface 97. In a manner similar to that in the case of the curved surfaces of the optical plates 89, 90 of the embodiment according to FIGS. 36 and 37, a linear progression of the height profile against the y-coordinate is superimposed on the cosine progression against the x-coordinate. In the case of negative y-values, the cosine progression of the height profile against the x-coordinate corresponds qualitatively to the progression according to FIG. 39. In the case of positive y-values, the cosine progression is exactly mirrored with one maximum in the region of x=0 and two minima in the case of negative and positive x-values. At y=0, the height of the curved surface 97 is constant independently of the x-coordinate. A saddle region of the curved surface 97 is therefore present here.

In the case of the illumination angle variation device 95, once again two refractive optical plates 96 embodied identically with regard to their height profiling are oriented with their curved optical surfaces with respect to one another such that, in a neutral position analogously to the position according to FIG. 36, an air gap between the two plates 96 has a constant z-extent independently of the x- or y-coordinate.

By the magnitude of a y-displacement, that is to say of a displacement parallel to the object displacement direction, a magnitude of a cosinusoidal air gap variation against the x-coordinate can once again be set. This leads to a telecentricity profile that is sinusoidal against the field height x (cf. FIG. 47). The magnitude of the extrema of this sine progression can be set in a continuously variable manner via the absolute value "Y" of the displacement of the two plates 96 with respect to one another, as already explained above in connection with FIG. 38 in the case of the illumination angle variation device 88.

A further embodiment of an illumination angle variation device 98 is explained below with reference to FIGS. 41 to 44. Components and functions corresponding to those which have already been described above with reference to FIGS. 1 to 40 bear the same reference numerals and will not be discussed in detail again.

In a manner comparable to the illumination angle variation devices 88 and 95, the illumination angle variation device 98 has two refractive optical plates 99, 100 each having a plane and a curved optical surface, wherein the two plates 99, 100 are arranged such that their curved surfaces face one another. The curved surfaces have a height profile in the deflection plane xz, that is to say perpendicular to the object displacement direction y, which follows a third-order polynomial.

Figure 41:
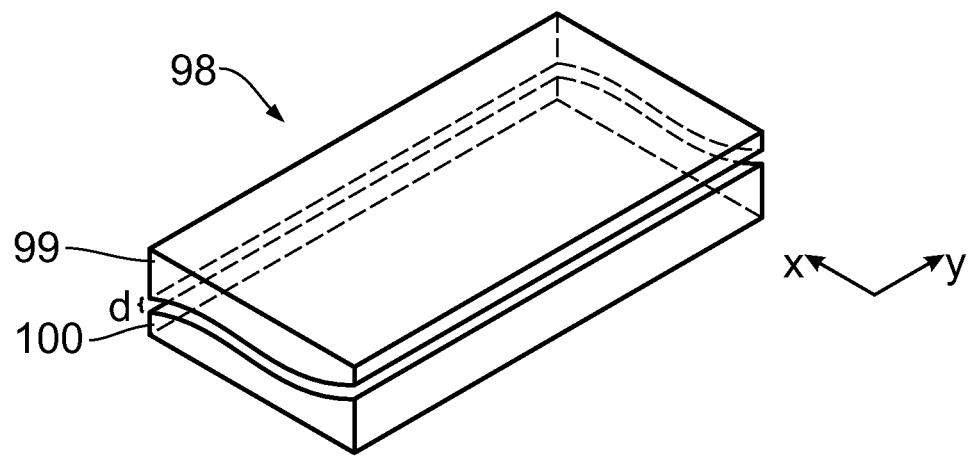
FIG. 41 shows, in an illustration similar to FIG. 37, a further embodiment of an illumination angle variation device including two refractive optical plates arranged in a displaceable fashion relative to one another perpendicular to the object displacement direction.

FIG. 41 shows the illumination angle variation device 98 with the plates 99, 100 in the neutral position, that is to say with a constant air gap d.

Figure 42:
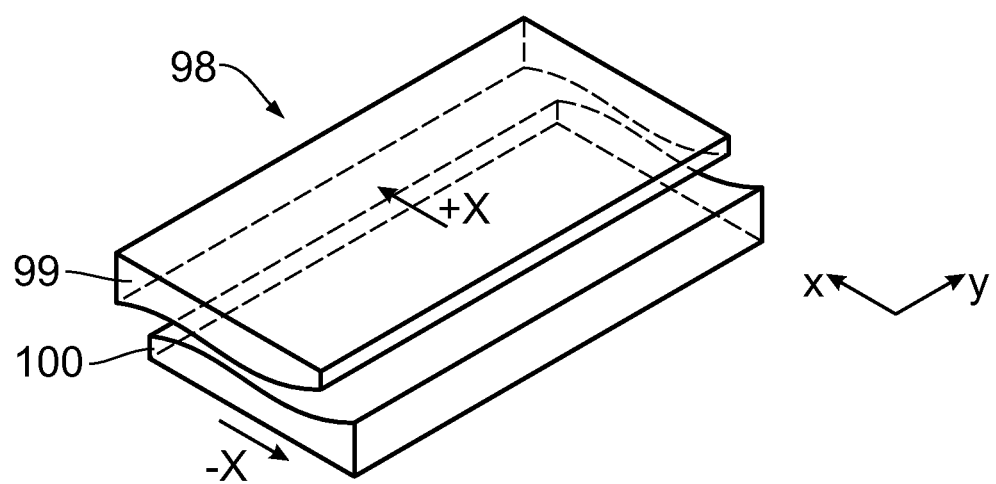
FIG. 42 shows the two plates according to FIG. 41 in a displacement position relative to one another after a displacement perpendicular to the object displacement direction.

FIG. 42 shows the plate 99 displaced by a displacement travel "+X" and the lower plate 100 displaced by a displacement travel "−X" in the x-direction, that is to say in a direction perpendicular to the object displacement direction y and in addition perpendicular to the beam path of the illumination light 8 through the illumination angle variation device 98. The displacement travels +X and −X relate to a displacement relative to stationary components of the illumination optical unit which predefine a course of the optical axis 2. One example of such a component relative to which the displacement travels +X and −X arise is the raster module 13.

Figure 43:
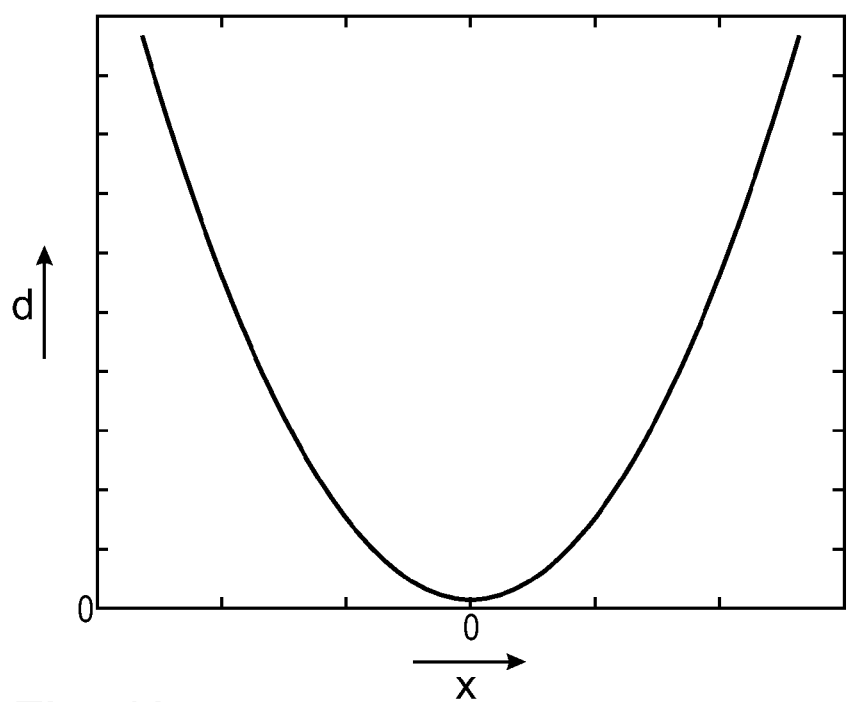
FIG. 43 shows a variation of an air gap between the two plates in the position according to FIG. 42, depending on the field height over the illumination field.
Figure 44:
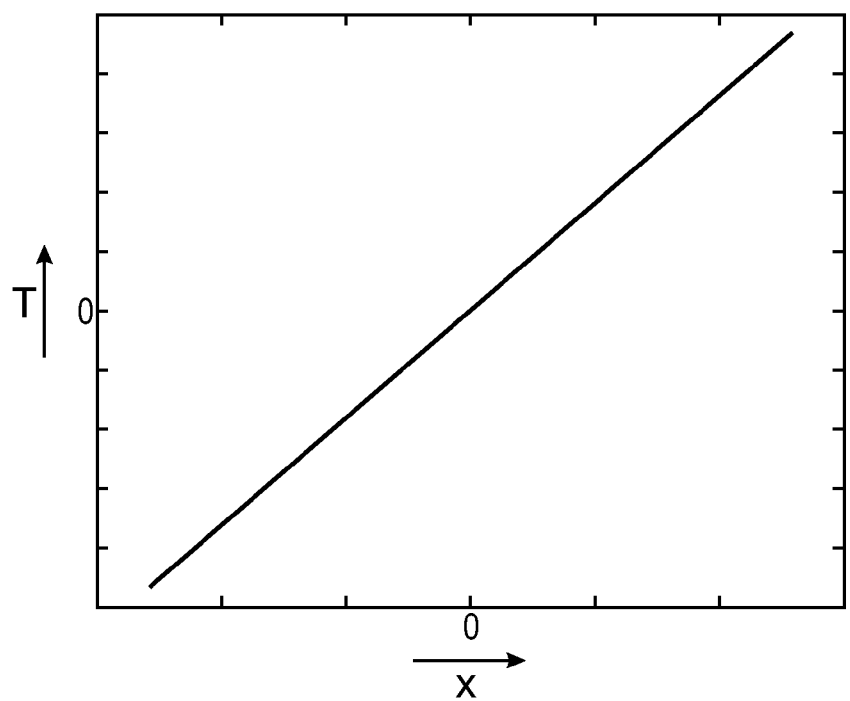
FIG. 44 shows a telecentricity value resulting on account of the air gap variation according to FIG. 43, once again plotted against the field height.

FIG. 43 shows, in the relative position of the plates 99, 100 according to FIG. 42, the dependence of a z-extent of the air gap d on the field height, that is to say on the x-dimension. Since the height profile of the plates 99, 100 is independent of the y-dimension, the same difference profile as illustrated in FIG. 43 results for each y-coordinate. In accordance with the height profile of the curved surfaces of the plates 99, 100 that is embodied as a third-order polynomial, a parabolic air gap variation results. This air gap variation has a global minimum in the case of the field height x=0. A telecentricity value dependence on the field height x as illustrated in FIG. 44 results in accordance with this difference profile or air gap profile. A linear progression of the telecentricity against the field height once again results. The gradient of the linear dependence of the telecentricity value variation against the field height results depending on the magnitude of the displacement travel "X" and depending on the choice of the polynomial function for the height profile of the curved surfaces of the plates 99, 100. With the illumination angle variation device 98, too, the gradient of the telecentricity value variation can be adapted in a continuously variable manner via the magnitude of the displacement travel "X".

Generally, the following holds true for the variation of the telecentricity value T:

$$T(x;X)=d/dx(H(x+X1)+H(x-X2))$$

H(x) here is the functional representation of the height profile of the plates 99 and 100. X1 denotes, by way of example, a positive displacement in direction of the x-axis and X2 denotes, by way of example, a displacement counter to the x-direction. In absolute terms, the displacement travels X1 and X2 can have different absolute value, but alternatively can also have the same absolute value.

A further embodiment of an illumination angle variation device 101 is described below with reference to FIGS. 45 to 48. Components and functions corresponding to those which have already been explained above with reference to FIGS. 1 to 44, and in particular with reference to FIGS. 36 to 44, bear the same reference numerals and will not be discussed in detail again.

Figure 45:
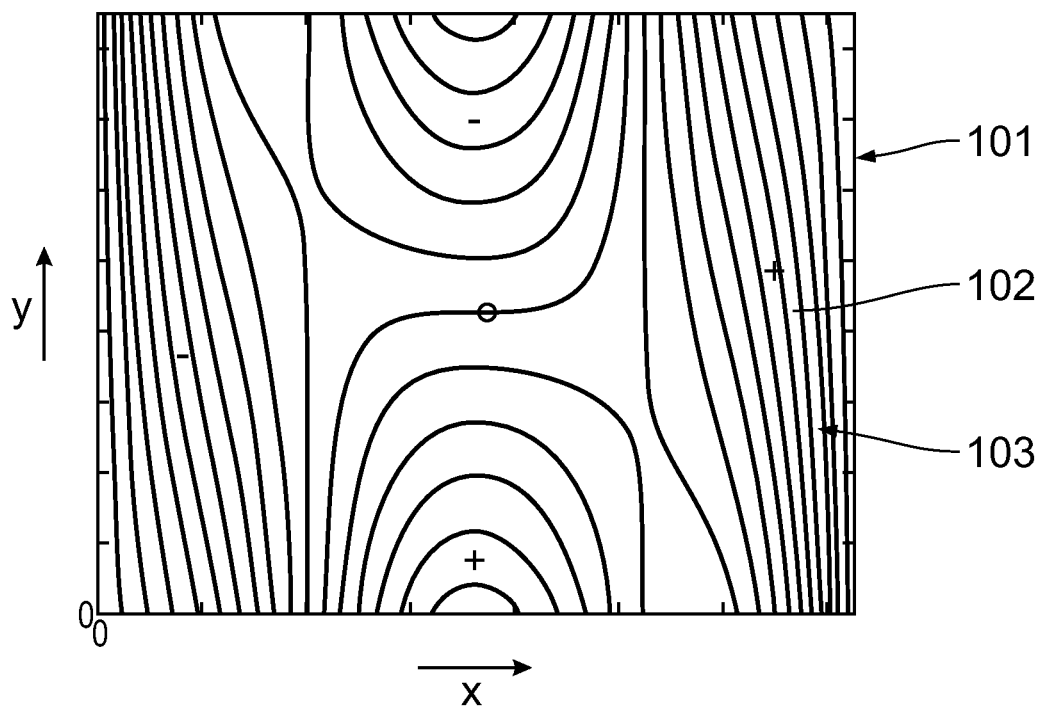
FIG. 45 shows, in a height profile illustration similar to FIG. 40, a surface shape of a curved surface of one of two plates of a further embodiment of an illumination angle variation device corresponding to a combination of those according to FIGS. 36 and 41.

FIG. 45 shows, in an illustration similar to FIG. 40, a height profile of a curved surface 102 of a refractive optical plate 103 of the illumination angle variation device 101. The height profile according to FIG. 45 results as the addition of the height profile of the optical plate 96 according to FIG. 40 to the height profile of the optical plate 100 according to FIG. 41. In the case of the illumination angle variation device 101, too, two refractive optical plates having identical height profiles in accordance with FIG. 45 are present, which are arranged with the curved surfaces facing one another such that, in a neutral position, a constant air gap arises over the entire extent of the two plates with respect to one another. This results in the illumination angle variation device 101 in which continuously variable telecentricity value variation settings can be implemented via a displacement of the two optical plates 103 both in the y-direction (cf. the explanations concerning the illumination angle variation device 95) and in the x-direction (cf. the explanations concerning the illumination angle variation device 98).

Figure 46:
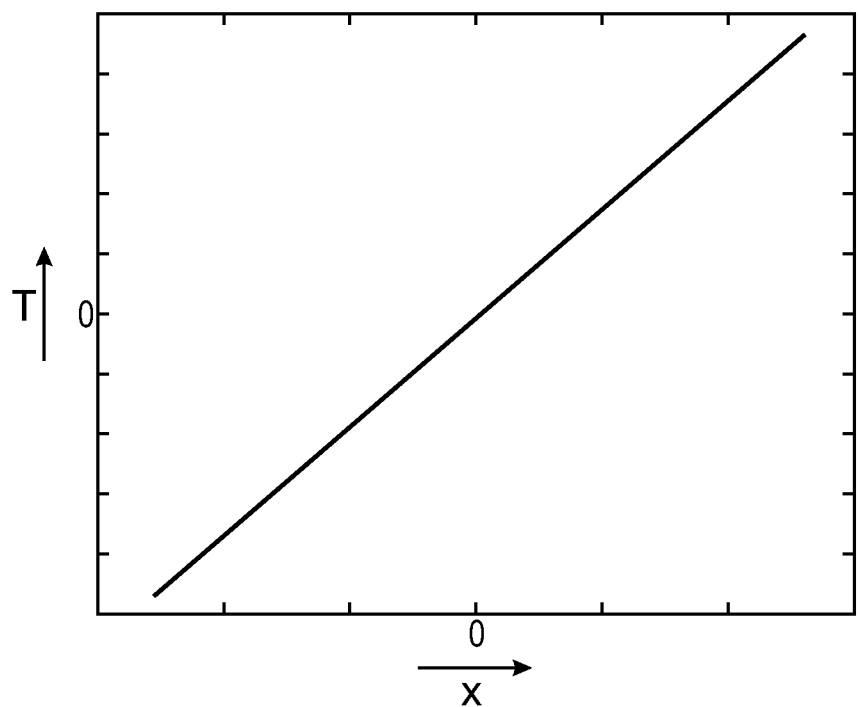
FIG. 46 shows a profile of a telecentricity value against the field height, generated via the illumination angle variation device including plates according to FIG. 45, in which the plates, proceeding from a zero position, are displaced with respect to one another perpendicular to the object displacement direction.
Figure 47:
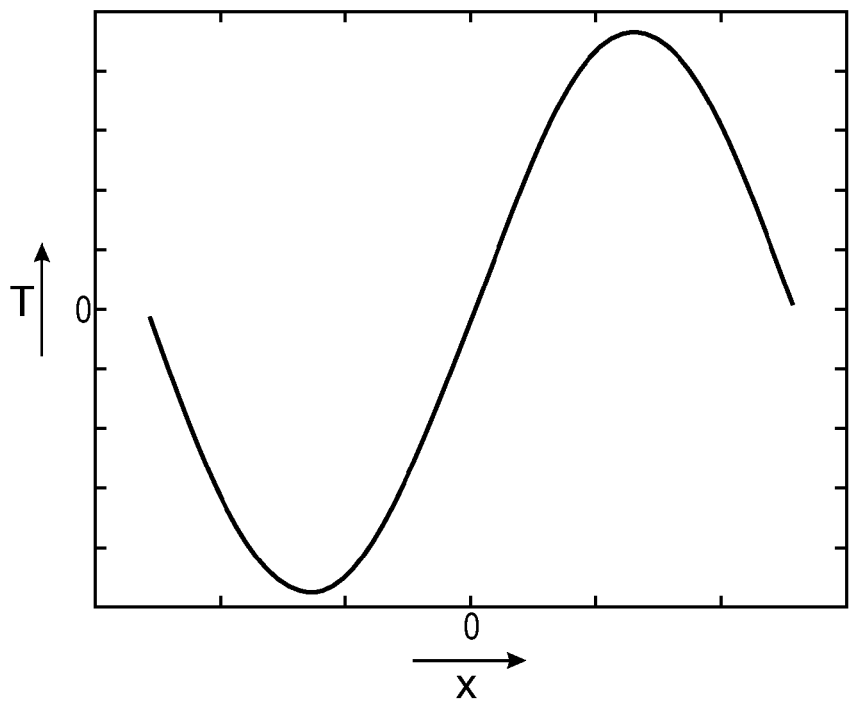
FIG. 47 shows a profile of a telecentricity value against the field height, generated via the illumination angle variation device including plates according to FIG. 45, in which the plates, proceeding from a zero position, are displaced with respect to one another parallel to the object displacement direction.
Figure 48:
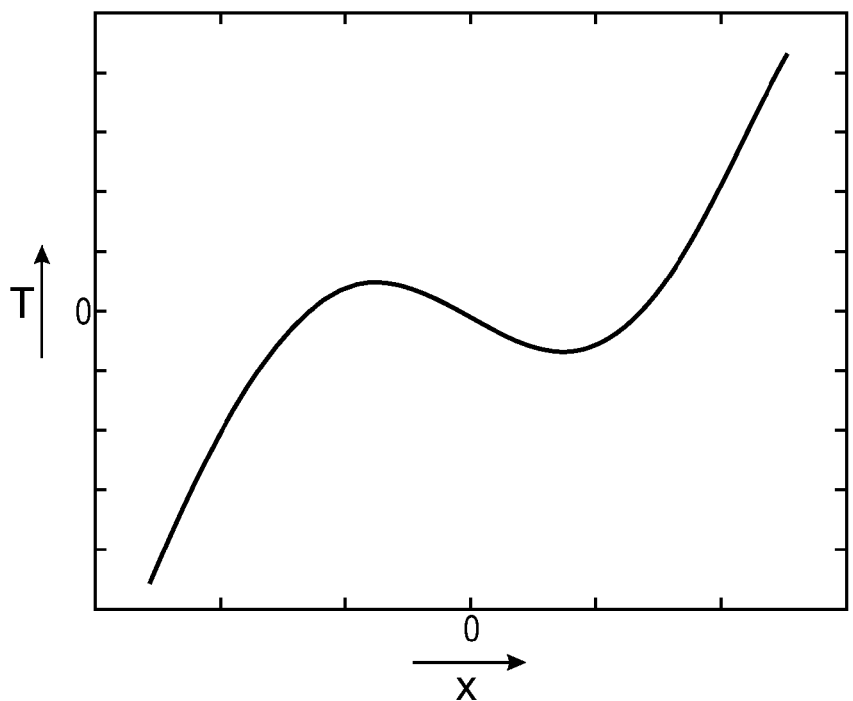
FIG. 48 shows a profile of a telecentricity value against the field height, generated via the illumination angle variation device including plates according to FIG. 45, in which the plates, proceeding from a zero position, are displaced with respect to one another both perpendicular and parallel to the object displacement direction.

In the case of a pure opposite displacement of the two plates in the x-direction, proceeding from the neutral position, that is to say in the case of |X1|=|X2|, a telecentricity value profile according to FIG. 46 results. In the case of a pure displacement in the y-direction, proceeding from the neutral position, a telecentricity value profile in accordance with FIG. 47 results. In the case of a displacement both in the x-direction and in the y-direction, proceeding from the neutral position, a telecentricity value profile according to FIG. 48 results, which can be understood as a superposition of the two telecentricity value profiles according to FIGS. 46 and 47.

A further embodiment—similar to FIG. 45—of an illumination angle variation device 104 is explained below with reference to FIGS. 49 to 51. Components and functions corresponding to those which have already been described above with reference to FIGS. 1 to 48, and in particular with reference to FIGS. 36 to 48, bear the same reference numerals and will not be discussed in detail again.

Figure 49:
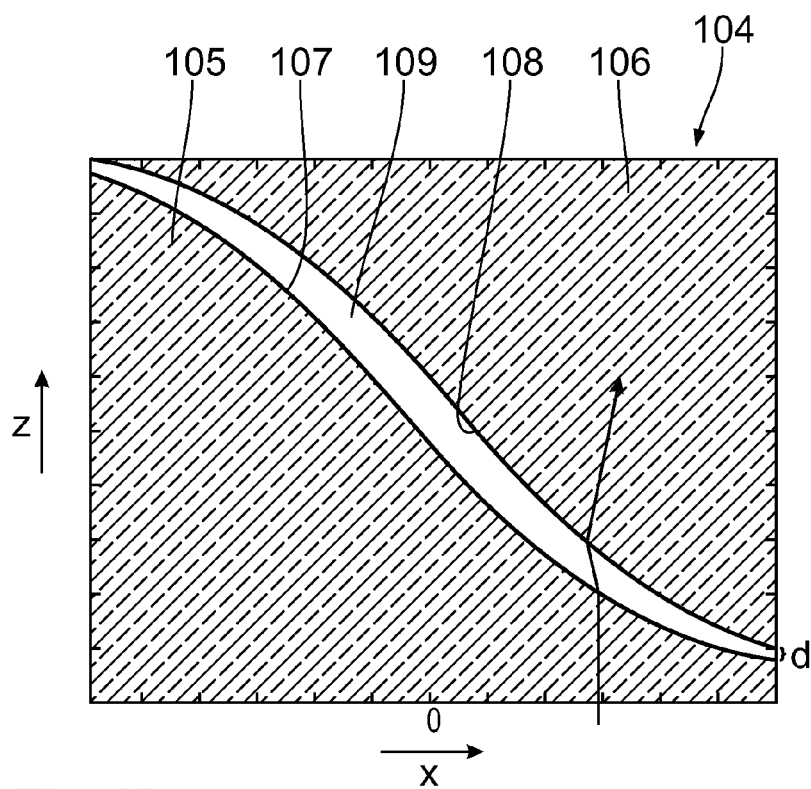
FIG. 49 shows a section through an air gap between two plates of a further embodiment of an illumination angle variation device, in which the plates, proceeding from a zero position, are displaced with respect to one another perpendicular to the object displacement direction, resulting in a V-shaped variation of an air gap extension against a plate coordinate parallel to the field height.
Figure 50:
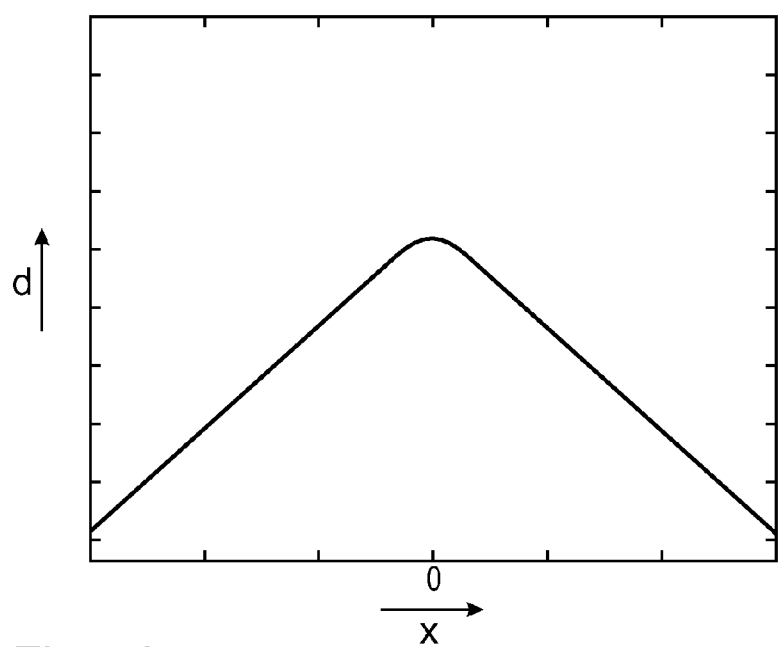
FIG. 50 shows the V-shaped variation of the air gap in the case of the illumination angle variation device according to FIG. 49.

The illumination angle variation device 104 has two refractive optical plates 105, 106, the height profiles of which are illustrated in an xz-section in FIG. 49. The two plates 105, 106 once again have outer plane optical surfaces and curved optical surfaces 107, 108 facing one another. There is an air gap 109 between these curved optical surfaces 107, 108. In the case of the illustrated relative displacement position "X" of the two plates 105, 106 with respect to one another, the air gap 109 has a z-extent which is maximal at x=0, that is to say in a center of a beam of the illumination light 8, and decreases linearly toward both sides toward the edge of the beam 8, that is to say in the direction of positive x-values and in the direction of negative x-values in FIG. 49. This overall V-shaped dependence of the air gap thickness d on the field height is illustrated once again in FIG. 50.

Figure 51:
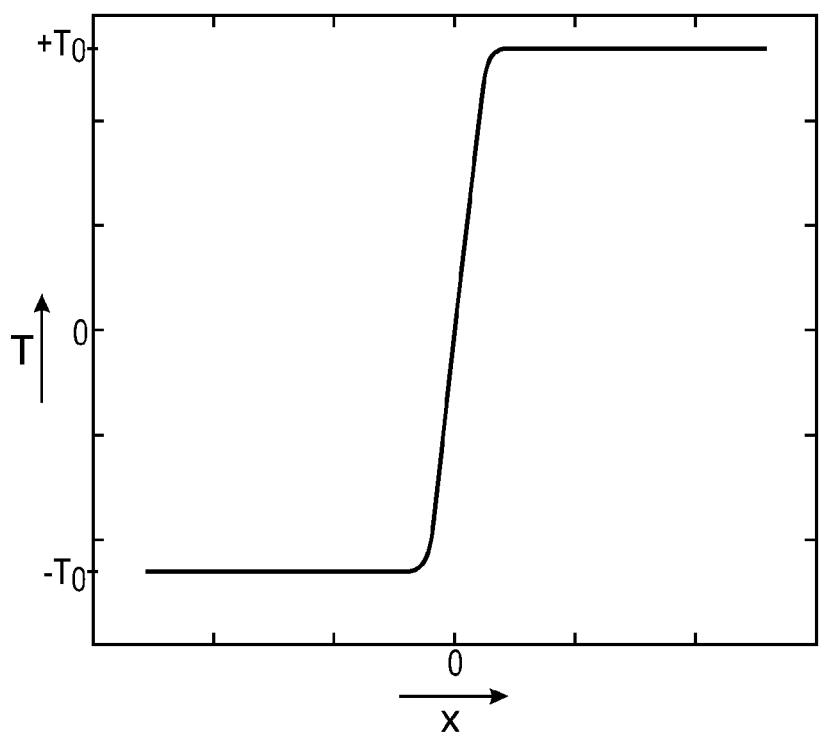
FIG. 51 shows a profile of the telecentricity value against the field height in the case of the illumination angle variation device in the relative position of the two plates according to FIG. 49.

FIG. 51 shows a variation of the telecentricity value T against the field height x, which variation follows from this arrangement of the optical plates 105, 106. The telecentricity value T has a step function and changes its value from a value $-T_0$ toward a value $+T_0$ at the field height x=0. For field height values having an absolute value of above a certain limit value, the telecentricity value is $+/-T_0$ in a constant manner at these values.

A further embodiment of an illumination angle variation device 110 is explained below with reference to FIGS. 52 to 55. Components and functions corresponding to those which have already been described above with reference to FIGS. 1 to 51, and particularly with reference to FIGS. 36 to 51, bear the same reference numerals and will not be discussed in detail again.

Figure 52:
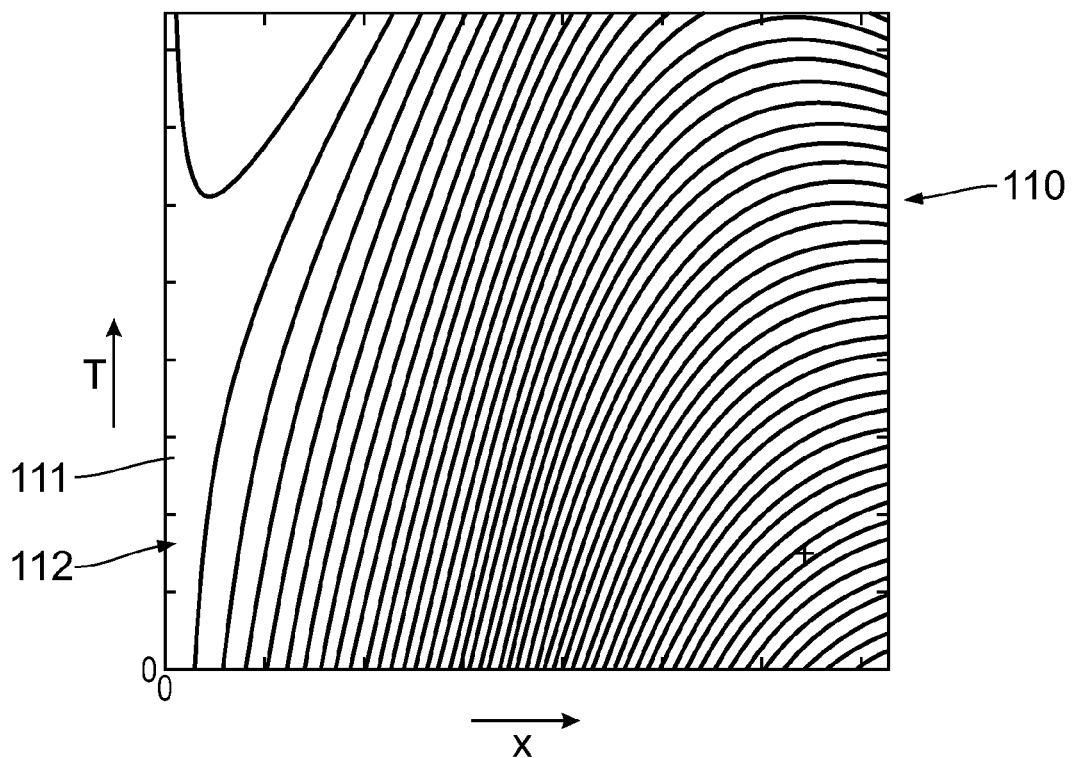
FIG. 52 shows, in a height profile illustration similar to FIGS. 40 and 45, a surface shape of a plate of a further embodiment of an illumination angle variation device, similar to those according to FIGS. 37 and 42.

FIG. 52 shows, in a height profile similar to that according to FIG. 45, a curved surface 111 of an optical plate 112 of the illumination angle variation device 110. An x-dependence of the height profile of the curved surface 110 corresponds to that according to FIG. 49 to a first approximation. In addition, the curved surface 111 is superimposed with a wedge in the x-direction, the thickness of which wedge varies linearly depending on the y-coordinate.

Figure 53:
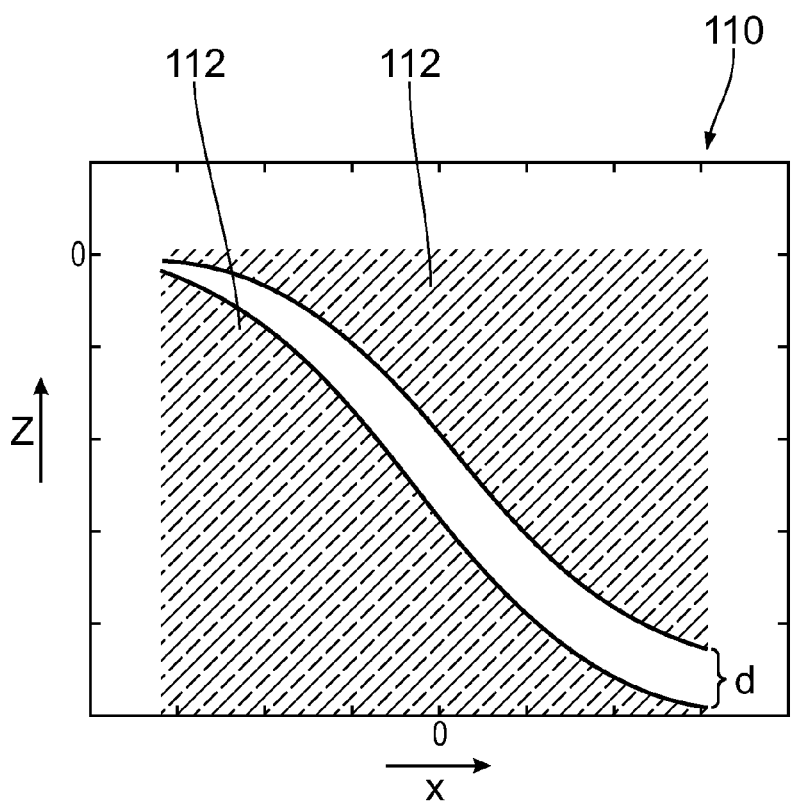
FIG. 53 shows, in an illustration similar to FIG. 49, an air gap variation against a plate coordinate parallel to the field height in the case of the illumination angle variation device including plates according to FIG. 52, in which the plates, proceeding from a zero position, are displaced with respect to one another parallel to the object displacement direction.

FIG. 53 shows in an xz-section the air gap between the plates for a y-displaced relative position of the plates 111, 112 with respect to one another. There the two optical plates 111, 112, once again embodied identically with regard to their height profiling, are arranged with the curved surfaces having the height profiles according to FIG. 52 facing one another such that an air gap d that increases in size in a wedge-shaped fashion additionally arises depending on the y-displacement.

Figure 54:
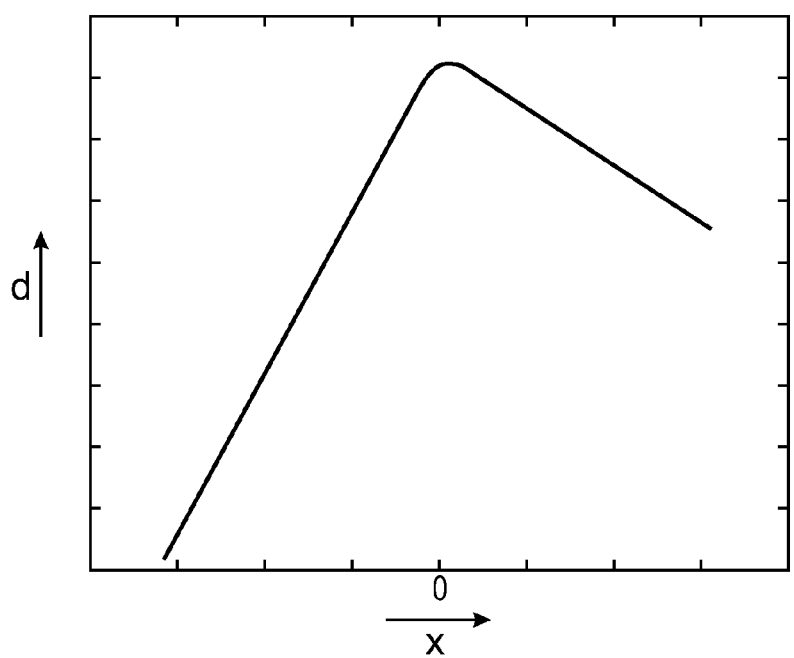
FIG. 54 shows, in the case of a given relative displacement in x- and y-directions of the plates of an illumination angle variation device according to FIG. 52, an air gap variation between the plates against a plate coordinate parallel to the field height.

FIG. 54 shows the air gap variation in the x-direction as a result of the superimposed effect on account of the additional y-displacement-dependent wedge contribution of the air gap variation in the x-direction. The originally symmetrical V-function is now tilted overall on account of the additional wedge contribution. At values x<0, the absolute value of the gradient of the air gap variation has a greater value than for values x>0.

Figure 55:
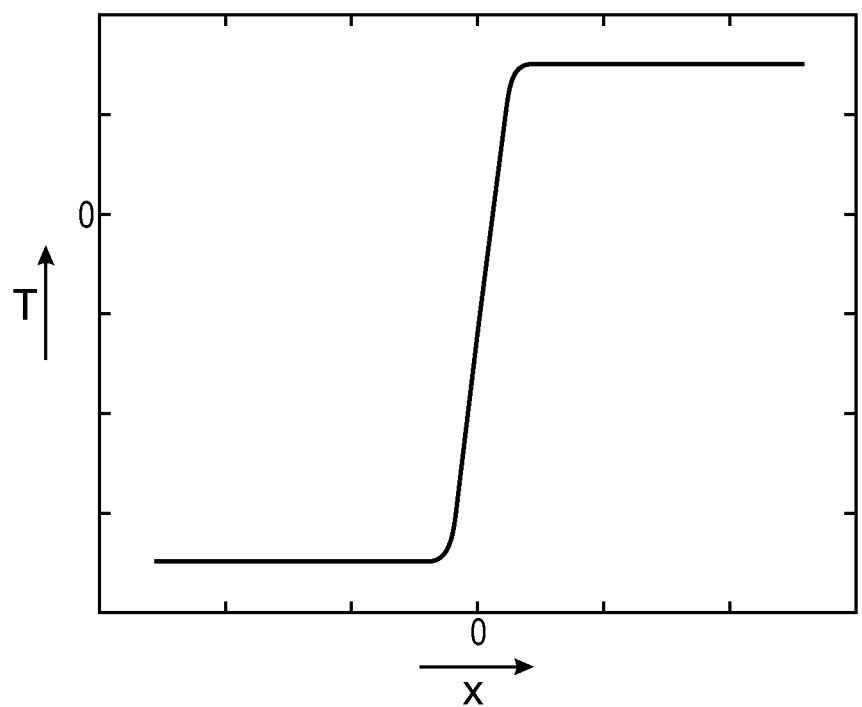
FIG. 55 shows a profile of a telecentricity value against the field height in the case of the air gap variation according to FIG. 54.

FIG. 55 shows the effect of the air gap variation according to FIG. 54 on the telecentricity value variation, depending on the field height x. There arises a telecentricity profile with an offset in which a greater absolute telecentricity value results for values x<0 than for values x>0, wherein once again, in a manner similar to that in the case of the telecentricity value profile according to FIG. 51, the telecentricity value experiences a step in the region of x=0.

In order to simplify the description of the mode of action, the illumination angle variation units illustrated in FIGS. 36 to 55 have always been described as plates each having a plane surface and a curved surface, the functionally effective curved surfaces facing one another. If it is advantageous for the construction and the function of the optical system, it is also possible, of course, for the effective curved surfaces also to be arranged in a manner facing away from one another. Moreover, it is possible to replace the plane surfaces by curved surfaces, in particular spherical surfaces, in particular if the corresponding illumination angle variation unit does not experience displacement transversely with respect to the optical axis.

Figure 56:
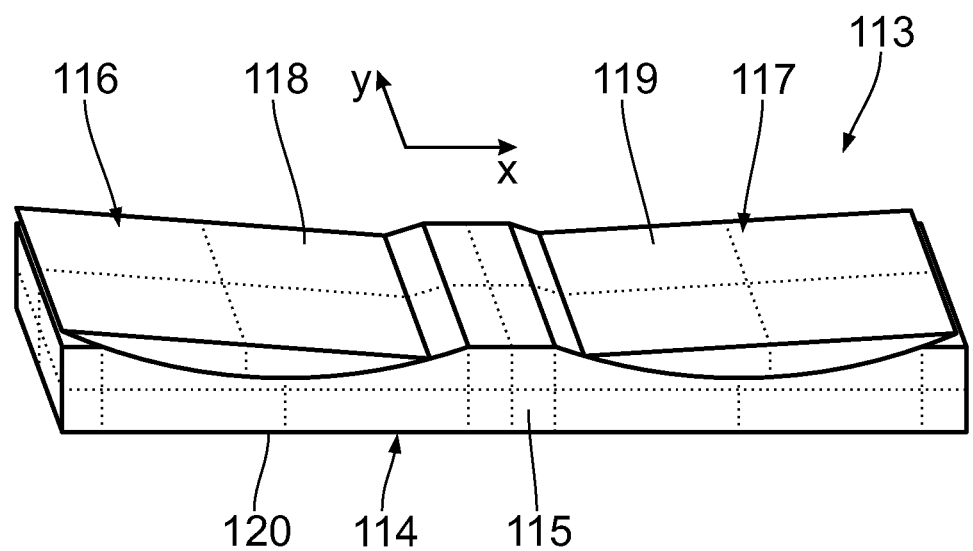
FIG. 56 shows a further embodiment of an illumination angle variation device including two pivotable planoconvex cylindrical lens elements.

FIG. 56 perspectively shows a further embodiment of an illumination angle variation device 113. The latter has a baseplate 114 composed of material that is refractive for the illumination light 8. The baseplate 114 has two concave-cylindrical surface portions, between which a plane-parallel central web 115 is arranged. Two planoconvex cylindrical lens elements 116, 117 are arranged in a complementary manner with respect to the two cylindrically concave regions on the right and left of the central web 115. The convex surfaces of the cylindrical lens elements 116, 117 face the concave surfaces of the baseplate 114 and have the same absolute curvature. The cylindrical lens elements 116, 117 are pivotable relative to the baseplate 114 about axes parallel to their cylinder axes, such that an angle of an outer plane surface 118, 119 of the cylindrical lens elements 116, 117 with respect to the optical exit surface 120 of the baseplate 114 can be set independently of one another. Correspondingly, it is possible to predefine a wavefront tilt for the portions of the beam of the illumination light 8 which is incident on the illumination angle variation device 113 on the right and left of the central web 115.

The respectively displaceable optical plate constitutes an overall displaceable illumination angle variation unit in the case of the illumination angle variation devices according to FIGS. 36 to 55.

The illumination angle variation devices explained above in connection with FIG. 36 et seq. represent examples including illumination angle variation units embodied as asphere surface components or as freeform surface components.

During the projection exposure, the reticle 23 and the wafer 22a are provided, the wafer bearing a coating which is light-sensitive to the illumination light 8. Afterward, at least one portion of the reticle 23 is projected onto the wafer 22a with the aid of the projection exposure apparatus 1. Finally, the light-sensitive layer exposed by the illumination light 8 on the wafer 22a is developed. The micro- or nanostructured component, for example a semiconductor chip, is produced in this way.

What is claimed is:

1. An illumination optical unit configured to illuminate an illumination field with illumination light, the illumination unit comprising:
 a raster arrangement comprising raster elements arranged in rows and columns, the raster elements being configured to influence the illumination light to predefine a shape of the illumination field;
 a transfer optical unit configured to superimposingly transfer the illumination light from the raster elements toward the illumination field; and
 an illumination angle variation device configured to deflect the illumination light incident on the illumination angle variation device in a deflection plane perpendicular to a direction in a location-dependent manner with different deflection angles, the direction being the direction in which an object in the illumination field is displaced during use of the illumination optical unit,
 wherein:
 the illumination angle variation device comprises an illumination angle variation unit displaceable overall relative to the raster arrangement and configured to generate a deflection angle for the illumination light in the deflection plane; and
 the displaceability of the illumination angle variation unit relative to the raster arrangement is configured to influence a magnitude of the deflection angle in the deflection plane.

2. The illumination optical unit of claim 1, wherein the illumination angle variation device further comprises a further illumination angle variation unit configured to generate a further deflection angle for the illumination light in the deflection plane, wherein the illumination angle variation units are configured to successively influence the illumination light.

3. The illumination optical unit of claim 1, further comprising a measuring device configured to measure an illumination parameter of the illumination light over the illumination field.

4. An optical system, comprising:
 the illumination optical unit of claim 1; and
 a projection optical unit configured to image at least part of the illumination field into an image field in an image plane.

5. A projection exposure apparatus, comprising:
 a primary light source;
 an optical system which comprises the illumination optical unit of claim 1 and a projection optical unit which is configured to image at least part of the illumination field into an image field in an image plane;
 an object holder comprising an object displacement drive configured to mount the object in the illumination field; and
 a wafer holder comprising a wafer displacement drive configured to mount a wafer in the image field.

6. A method, comprising:
 using an optical system comprising an illumination optical unit according to claim 1 to illuminate a reticle, the reticle comprising structures; and
 using a projection optical unit to project at least part of the reticle onto a region of a layer of light-sensitive material.

7. The illumination optical unit of claim 1, wherein the illumination field is configured so that an object is arrangeable in the illumination field.

8. The illumination optical unit of claim 1, wherein the illumination field is configured so that a reticle is arrangeable in the illumination field.

9. The illumination optical unit of claim 1, wherein the illumination angle variation unit is embodied pivotable about an optical axis of the illumination optical unit.

10. The illumination optical unit of claim 3, wherein the further illumination angle variation unit is a static unit.

11. The illumination optical unit of claim 3, wherein the further illumination angle variation unit is configured to generate generates static deflection angles which are different in absolute terms in at least two angle variation portions.

12. The illumination optical unit of claim 3, wherein a maximum deflection effect of the illumination angle variation unit is less than a maximum deflection effect of the further illumination angle variation unit.

13. The illumination optical unit of claim 1, wherein the illumination angle variation unit is selected from the group consisting of a roof edge prism, a cylindrical lens element, a saddle surface component, an asphere surface component, a freeform surface component, a wedge body, and a lens element.

14. The illumination optical unit of claim 1, wherein the illumination angle variation units is a wedge body, $|dy/dx| \geq 2$ for a gradient of a wedge edge region in the plane perpendicular to the beam direction of the illumination light, where z is the beam direction, y runs along the object displacement direction and the plane perpendicular to the beam direction is in the x and y directions.

15. The illumination optical unit of claim 3, further comprising a displacement drive configured to displace the illumination angle variation unit with respect to the raster arrangement, wherein the measuring device is signal-connected to the displacement drive via a control/regulating unit.

* * * * *

UNITED STATES PATENT AND TRADEMARK OFFICE
CERTIFICATE OF CORRECTION

PATENT NO. : 9,753,375 B2  
APPLICATION NO. : 14/327721  
DATED : September 5, 2017  
INVENTOR(S) : Axel Scholz et al.

Page 1 of 1

It is certified that error appears in the above-identified patent and that said Letters Patent is hereby corrected as shown below:

In the Claims

Column 33, Line 15, Claim 11, after "generate", delete "generates".

Signed and Sealed this  
Twenty-ninth Day of May, 2018

Andrei Iancu  
*Director of the United States Patent and Trademark Office*